United States Patent
Caveney et al.

(10) Patent No.: US 9,761,478 B2
(45) Date of Patent: Sep. 12, 2017

(54) SUBSTRATE TRANSPORT APPARATUS

(71) Applicant: BROOKS AUTOMATION, INC., Chelmsford, MA (US)

(72) Inventors: Robert T. Caveney, Windham, NH (US); Ulysses Gilchrist, Reading, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 15/114,275

(22) PCT Filed: Jan. 28, 2015

(86) PCT No.: PCT/US2015/013280
§ 371 (c)(1),
(2) Date: Jul. 26, 2016

(87) PCT Pub. No.: WO2015/116674
PCT Pub. Date: Aug. 6, 2015

(65) Prior Publication Data
US 2017/0040203 A1    Feb. 9, 2017

Related U.S. Application Data

(60) Provisional application No. 61/932,538, filed on Jan. 28, 2014.

(51) Int. Cl.
*H01L 21/677* (2006.01)
*H01L 21/687* (2006.01)

(52) U.S. Cl.
CPC .. *H01L 21/68707* (2013.01); *H01L 21/67742* (2013.01)

(58) Field of Classification Search
CPC .... B25J 11/0095; H01L 21/67; H01L 21/677; H01L 21/67742; H01L 21/68707
See application file for complete search history.

(56) References Cited

U.S. PATENT DOCUMENTS 6,722,834 B1   4/2004   Tepman
6,737,826 B2   5/2004   Gilchrist
(Continued)

FOREIGN PATENT DOCUMENTS

JP       2015036184 A  *  2/2015  ............. B65G 47/90
JP   WO 2016056119 A1  *  4/2016  ........... H01L 21/677

OTHER PUBLICATIONS

International Search Report, International Application No. PCT/US2015/013280, dated May 6, 2015.

*Primary Examiner* — Kaitlin Joerger
(74) *Attorney, Agent, or Firm* — Perman & Green LLP; Colin C. Durham

(57) ABSTRACT

A substrate transport apparatus including a frame, an upper arm rotatably mounted to the frame about a shoulder axis, a forearm rotatably mounted to the upper arm about an elbow axis where the forearm includes stacked forearm sections dependent from the upper arm through a common joint, and independent stacked end effectors rotatably mounted to the forearm, the forearm being common to the independent stacked end effectors, wherein at least one end effector is mounted to the stacked forearm sections at a wrist axis, where the forearm is configured such that spacing between the independent stacked end effectors mounted to the stacked forearm sections is decoupled from a height build up between end effectors accommodating pass through instrumentation.

42 Claims, 21 Drawing Sheets

(56) References Cited

U.S. PATENT DOCUMENTS

| | | | |
|---|---|---|---|
| 7,578,649 B2* | 8/2009 | Caveney | B25J 9/042 |
| | | | 414/744.1 |
| 8,007,218 B2 | 8/2011 | Park et al. | |
| 8,016,542 B2* | 9/2011 | Cox | H01L 21/67742 |
| | | | 414/744.5 |
| 8,264,187 B2 | 9/2012 | Laceky et al. | |
| 8,376,685 B2* | 2/2013 | Pietrantonio | B25J 9/042 |
| | | | 414/744.5 |
| 8,573,919 B2* | 11/2013 | Gilchrist | B25J 9/0087 |
| | | | 414/744.5 |
| 9,190,306 B2* | 11/2015 | Blank | B25J 9/042 |
| 9,248,568 B2* | 2/2016 | Caveney | H01L 21/67766 |
| 9,254,566 B2* | 2/2016 | Hashimoto | B25J 9/042 |
| 9,259,841 B2* | 2/2016 | Shimada | B25J 9/043 |
| 9,616,577 B2* | 4/2017 | Hashimoto | B25J 15/0014 |
| 2013/0121798 A1 | 5/2013 | Hosek | |
| 2014/0271055 A1* | 9/2014 | Weaver | H01L 21/67161 |
| | | | 414/221 |
| 2015/0098790 A1* | 4/2015 | Wakabayashi | H01L 21/67742 |
| | | | 414/805 |

* cited by examiner

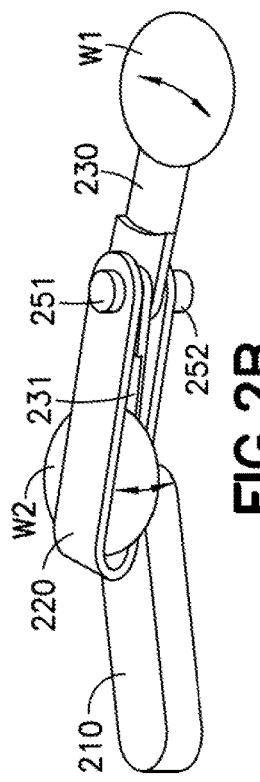
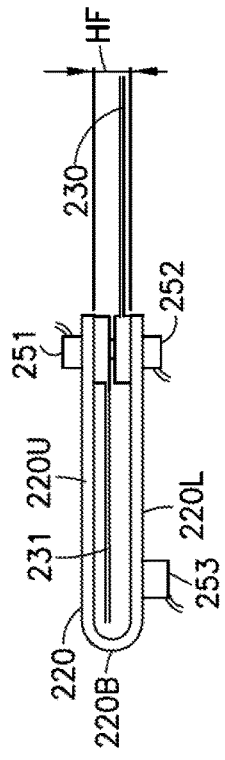
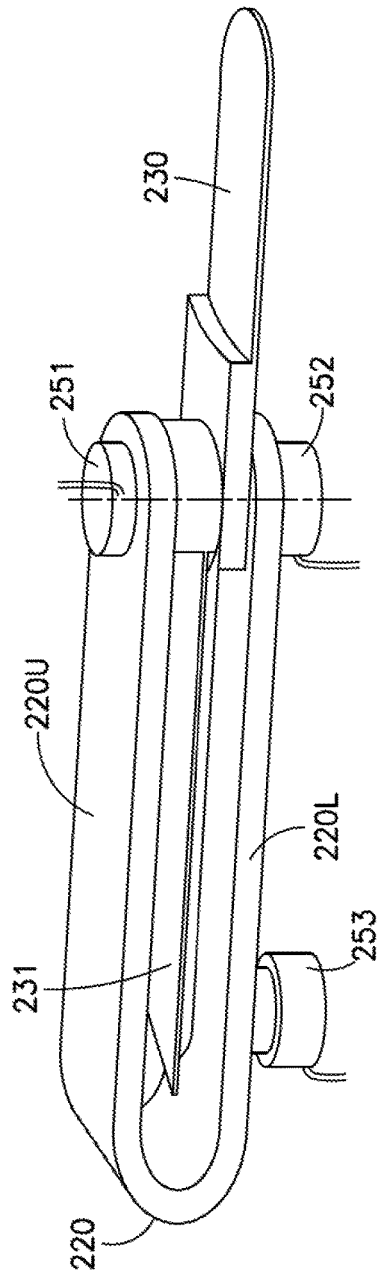
FIG.2B
FIG.2C
FIG.2D

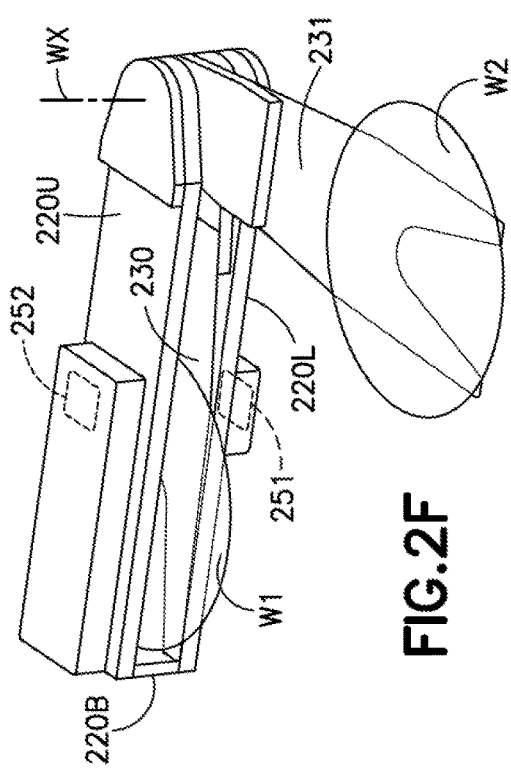
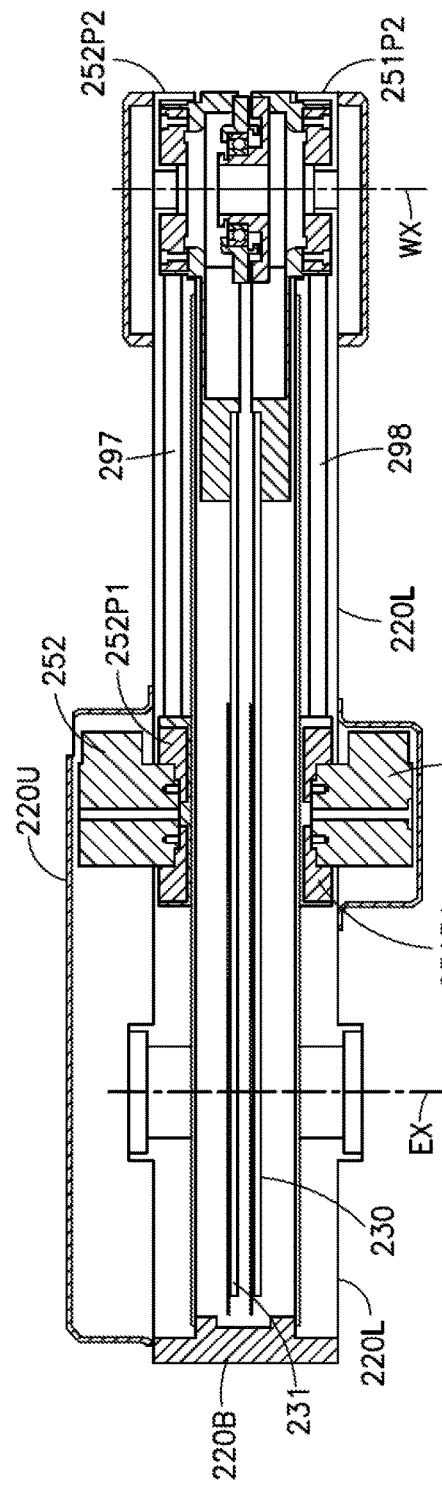

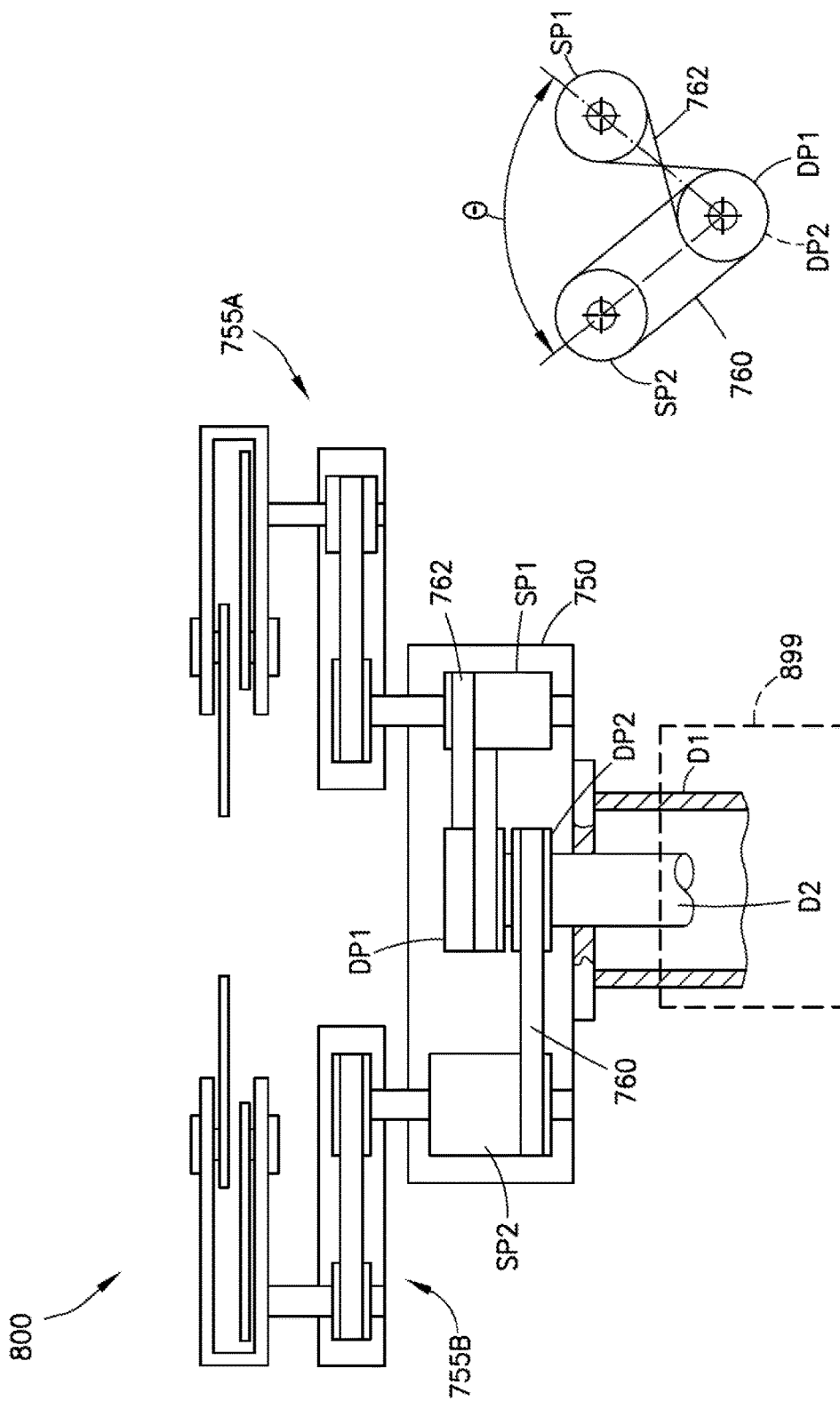

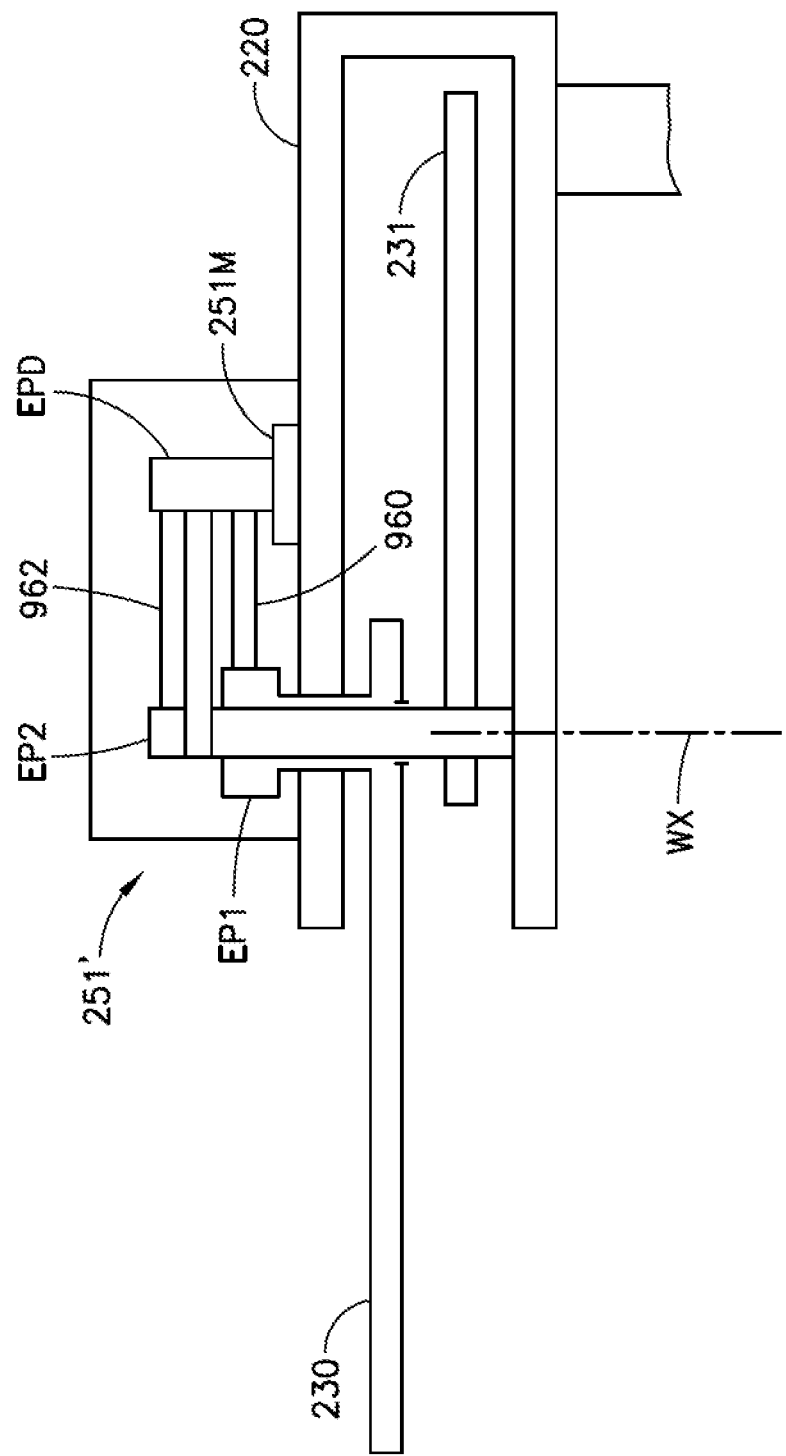

SUBSTRATE TRANSPORT APPARATUS

CROSS-REFERENCE TO RELATED APPLICATION

This application is the National Stage of International Application No. PCT/US2015/013280, having an International Filing Date of 28 Jan. 2015, which designates the United States of America, and which International Application was published under PCT Article 21 (2) as WO Publication No. 2015/116674 A1, which claims priority from, and the benefit of U.S. Provisional Patent Application No. 61/932,538 filed on Jan. 28, 2014, the disclosures of which are incorporated herein by reference in their entireties.

BACKGROUND

1. Field

The aspects of the disclosed embodiment generally relate to substrate transports and, more particularly, to robotic substrate transports.

2. Brief Description of Related Developments

Generally substrate transport apparatus used in, for example, transporting semiconductor wafers or substrates have a transport arm and one or more end effectors for holding the substrates rotatably coupled to the transport arm at a common wrist joint. As such, the end effectors are allowed to rotate relative to one another about the common wrist axis. Where the substrate transport apparatus has more than one end effector, the end effectors are generally coaxially stacked at the common wrist joint where all electronic and/or vacuum connections as well as drive components pass through the transport arm and into each of the end effectors through the common wrist joint (where the electrical and pneumatic connections for the upper end effectors in the stack pass through the lower end effectors). However, it may become costly and difficult to route the electrical wires and pneumatic (including vacuum) lines to each end effector through the common wrist joint (and through the stack of end effectors) because of the relative motion that is required between each end effector in the stack of end effectors, the wrist pivot joint and the remaining transport arm components. For example, electrical wire/pneumatic line twist may occur limiting rotation of the end effectors and/or kinking of the pneumatic lines may occur. Slip rings and other rotational electrical/pneumatic couplings may be provided however this may increase manufacturing and operational (i.e. maintenance) costs associated with the substrate transport apparatus.

It would be advantageous to provide a substrate transport that allows for multiple independently rotatable end effectors that are disposed adjacent one another on a common axis of rotation and having substantially direct routing of wires and pneumatic lines to each end effector.

BRIEF DESCRIPTION OF THE DRAWINGS

The foregoing aspects and other features of the disclosed embodiment are explained in the following description, taken in connection with the accompanying drawings, wherein:

FIGS. 2A-2D are schematic illustrations of a substrate transport apparatus in accordance with aspects of the disclosed embodiment;

FIGS. 2F and 2G are schematic illustrations of a portion of a substrate transport apparatus in accordance with aspects of the disclosed embodiment;

FIGS. 8A and 8B are schematic illustrations of a portion of a substrate transport apparatus in accordance with an aspect of the disclosed embodiment;

FIG. 9 is a schematic illustration of a portion of a substrate transport apparatus in accordance with an aspect of the disclosed embodiment.

DETAILED DESCRIPTION

FIGS. 1A-1D illustrate schematic views of substrate processing apparatus or tools incorporating aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

Figure 1A:
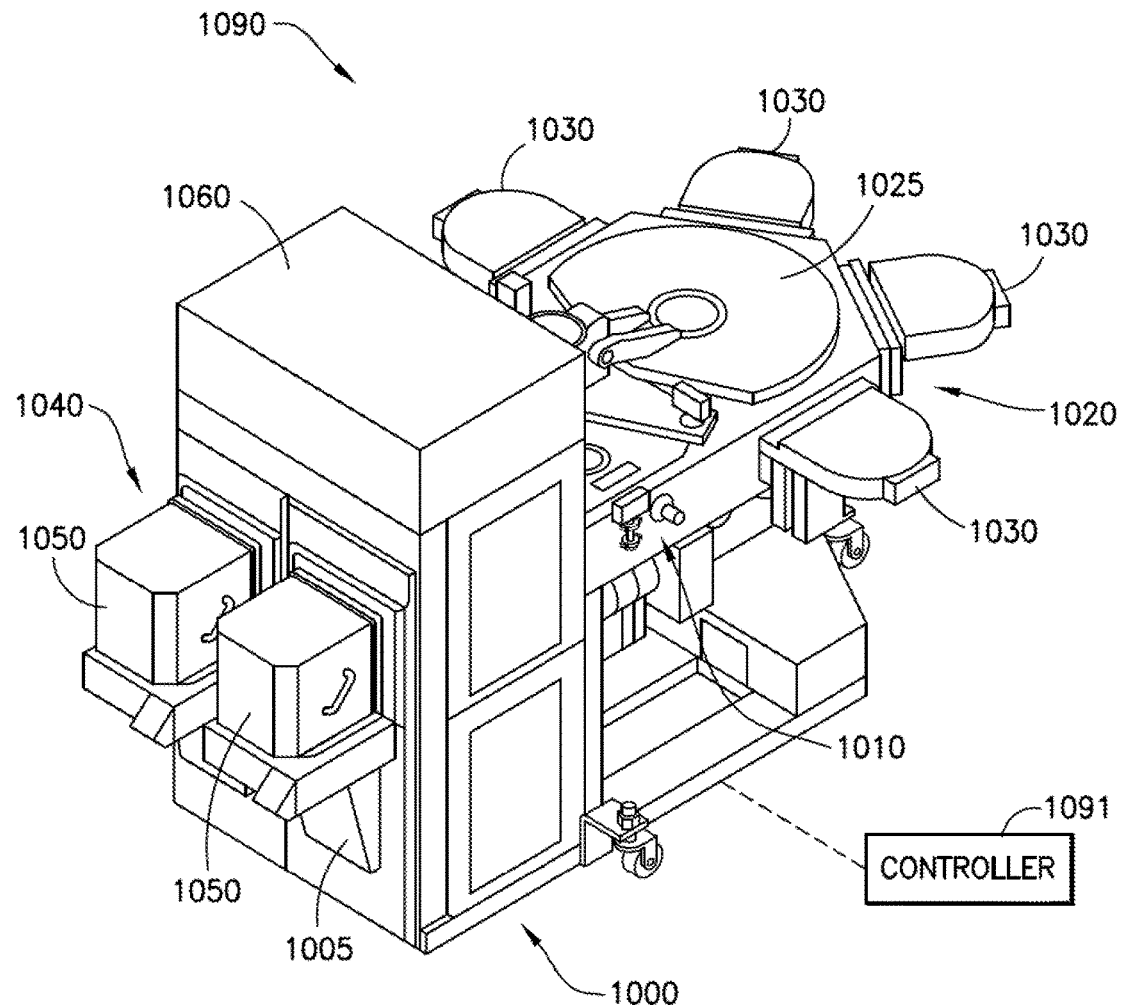
FIGS. 1A-1C and 1D are schematic illustrations of a substrate processing apparatus in accordance with aspects of the disclosed embodiment.
Figure 1B:
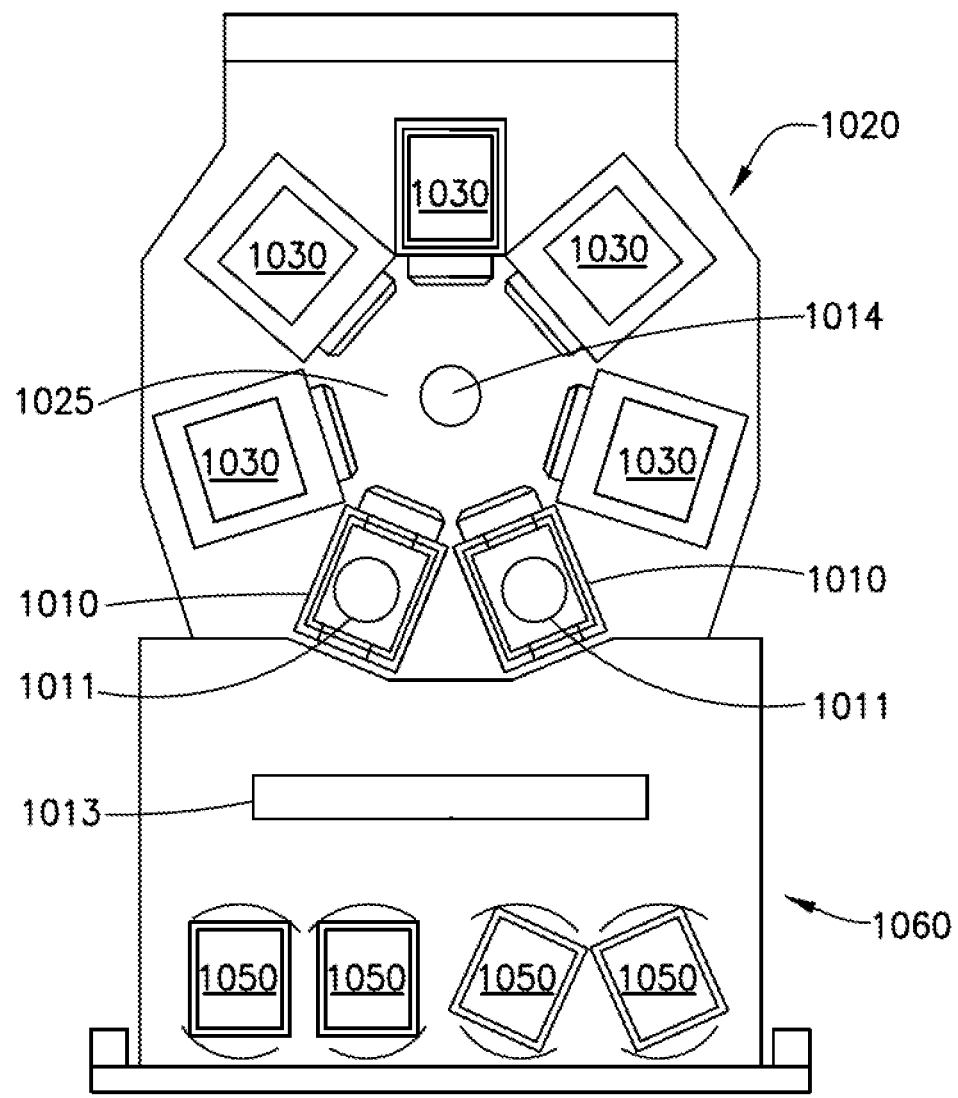

In FIGS. 1A and 1B, a processing apparatus, such as for example a semiconductor tool station 1090 is shown in accordance with an aspect of the disclosed embodiment. Although a semiconductor tool is shown in the drawings, the embodiments described herein can be applied to any tool station or application employing robotic manipulators. In this example the tool 1090 is shown as a cluster tool, however the aspects of the disclosed embodiment may be applied to any suitable tool station such as, for example, a linear tool station such as that shown in FIGS. 2C and 2D and described in U.S. patent application Ser. No. 11/442,511, entitled "Linearly Distributed Semiconductor Workpiece Processing Tool," filed May 26, 2006, the disclosure of which is incorporated by reference herein in its entirety. The tool station 1090 generally includes an atmospheric front end 1000, a vacuum load lock 1010 and a vacuum back end 1020. In other aspects, the tool station may have any suitable configuration. The components of each of the front end 1000, load lock 1010 and back end 1020 may be connected to a controller 1091 which may be part of any suitable control architecture such as, for example, a clustered architecture control. The control system may be a closed loop controller having a master controller, cluster controllers and autonomous remote controllers such as those disclosed in U.S. Pat. No. 7,904,182, the disclosure of which is incorporated by reference herein in its entirety. In other aspects, any suitable controller and/or control system may be utilized.

In aspects of the disclosed embodiment, the front end 1000 generally includes load port modules 1005 and a mini-environment 1060 such as for example an equipment front end module (EFEM). The load port modules 1005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer interfaces, 450 mm wafer interfaces or any other suitable substrate interfaces such as for example larger or smaller wafers or flat panels for liquid crystal display panels, solar panels or other suitable payloads. Although two load port modules are shown in FIG. 1A, in other aspects any suitable number of load port modules may be incorporated into the front end 1000. The load port modules 1005 may be configured to receive substrate carriers or cassettes 1050 from an overhead transport system, automatic guided vehicles, person guided vehicles, rail guided vehicles or from any other suitable transport method. The load port modules 1005 may interface with the mini-environment 1060 through load ports 1040. The load ports 1040 may allow the passage of substrates between the substrate cassettes 1050 and the mini-environment 1060. The mini-environment 1060 generally includes any suitable transport apparatus 1013 which may be substantially similar to the transport apparatus described below in accordance with the aspects of the disclosed embodiment. In one aspect the transport apparatus 1013 may be a track mounted robot such as that described in, for example, U.S. Pat. No. 6,002,840, the disclosure of which is incorporated by reference herein in its entirety. The mini-environment 1060 may provide a controlled, clean zone for substrate transfer between multiple load port modules.

The vacuum load lock 1010 may be located between and connected to the mini-environment 1060 and the back end 1020. The load lock 1010 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. The load lock 1010 may also include an aligner 1011 for aligning a fiducial of the substrate to a desired position for processing. In other aspects, the vacuum load lock may be located in any suitable location of the processing apparatus and have any suitable configuration.

The vacuum back end 1020 generally includes a transport chamber 1025, one or more processing station(s) 1030 and a transport apparatus 1014. The transport apparatus 1014 will be described below and may be located at least partly within the transport chamber 1025 to transport substrates between the load lock 1010 and the various processing stations 1030. The processing stations 1030 may operate on the substrates through various deposition, etching, or other types of processes to form electrical circuitry or other desired structure on the substrates. Typical processes include but are not limited to thin film processes that use a vacuum such as plasma etch or other etching processes, metal organic chemical vapor deposition (MOCVD), chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 1030 are connected to the transport chamber 1025 to allow substrates to be passed from the transport chamber 1025 to the processing stations 1030 and vice versa.

Figure 1C:
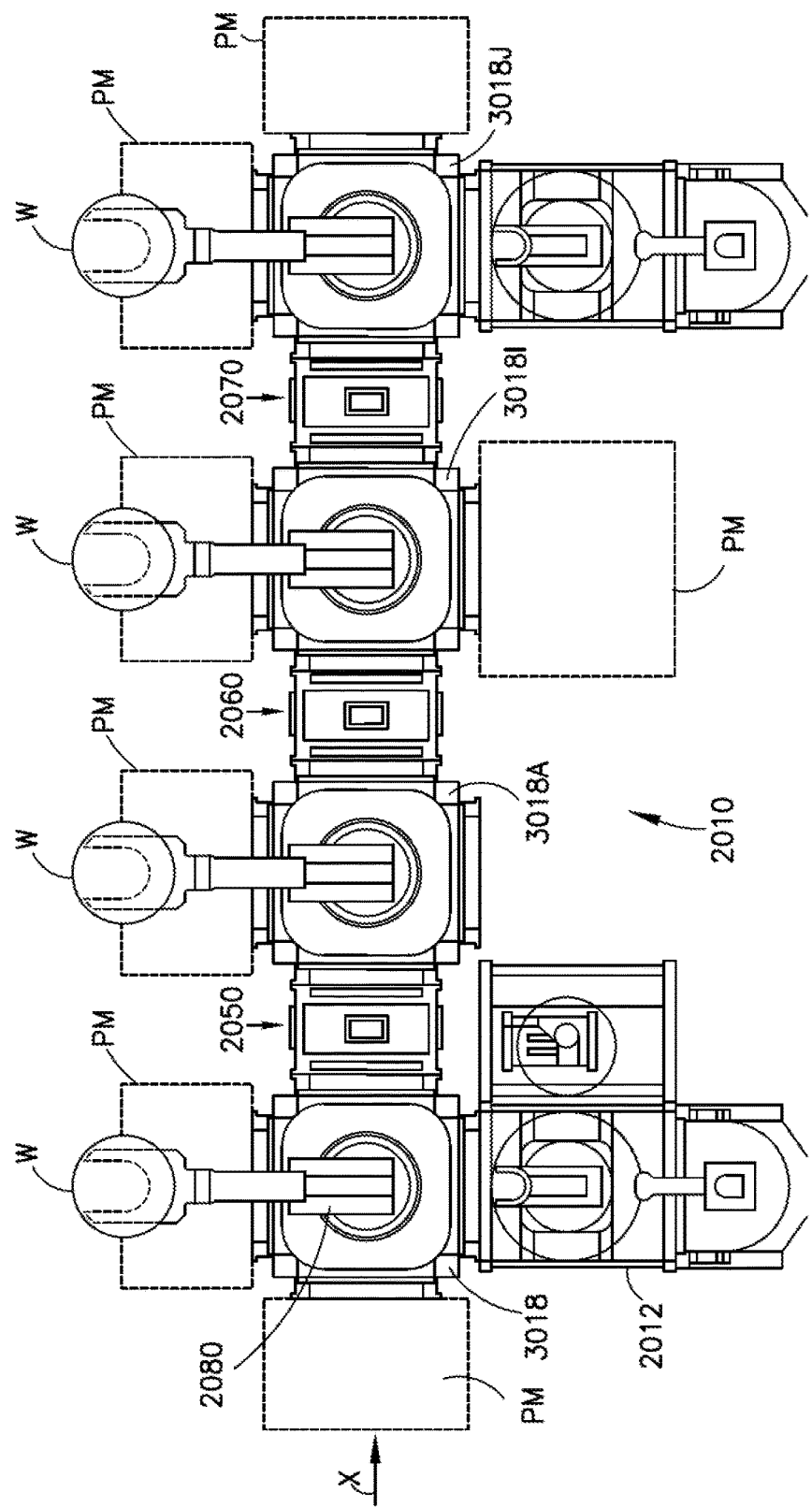

Referring now to FIG. 1C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 30181, 3018J to interfaces 2050, 2060, 2070 as described in U.S. patent application Ser. No. 11/442,511, previously incorporated herein by reference. Each transport chamber module 3018, 3019A, 30181, 3018J includes a substrate transport 2080 as will be described in greater detail below for transporting substrates W throughout the processing system 2010 and into and out of, for example, processing modules PM. As may be realized, each chamber module may be capable of holding an isolated or controlled atmosphere (e.g. N2, clean air, vacuum).

Figure 1D:
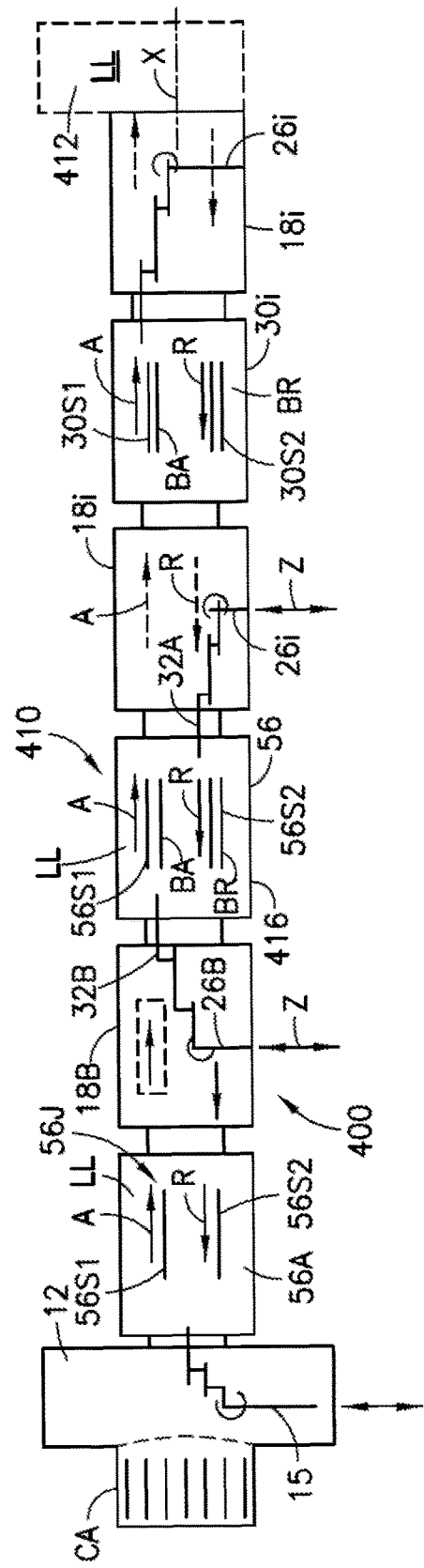

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another substrate entry/exit station 412 for example at an opposite end from interface station 12. In other aspects of the disclosed embodiment, other entry/exit stations for inserting/removing substrates from the transport chamber may be provided. Interface section 12 and entry/exit station 412 may allow loading and unloading of substrates from the tool. In other aspects, substrates may be loaded into the tool from one end and removed from the other end. The transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56B and substrate stations forming the transport chamber 416 shown in FIG. 1D is merely exemplary, and in other aspects of the disclosed embodiment the transport chamber may have more or fewer modules disposed in any desired modular arrangement. In the aspect of the disclosed embodiment shown, station 412 may be a load lock. In other aspects, a load lock module may be located between the end entry/exit station (similar to station 412) or the adjoining transport chamber module (similar to module 18i) may be configured to operate as a load lock. As also noted before, transport chamber modules 18B, 18i have one or more corresponding transport apparatus 26B, 26i located therein. The transport apparatus 26B, 26i of the respective transport chamber modules 18B, 18i may cooperate to provide the linearly distributed substrate transport system 420 in the transport chamber. In one aspect, the transport apparatus 26B may be configured to transport any suitable payloads and have arm(s) arranged to provide what may be referred to as fast swap arrangement allowing the transport to quickly swap wafers from a pick/place location. As seen in FIG. 1D, in this embodiment the modules 56A, 56, 30i may be located interstitially between transfer chamber modules 18B, 18i and may define suitable processing modules, load lock(s), buffer station(s), metrology station(s) or any other desired station(s). For example the interstitial modules, such as load locks 56A, 56 and substrate station 30i, may each have stationary substrate supports/shelves 56S, 56S1, 56S2, 30S1, 30S2 that may cooperate with the transport arms to effect transport of substrates through the length of the transport chamber along linear axis X of the transport chamber. By way of example, substrate(s) may be loaded into the transport chamber 416 by interface section 12. The substrate(s) may be positioned on the support(s) of load lock module 56A with the transport arm 15 of the interface section. The substrate(s), in load lock module 56A, may be moved between load lock module 56A and load lock module 56 by the transport arm 26B in module 18B, and in a similar and consecutive manner between load lock 56 and substrate station 30i with arm 26i (in module 18i) and between station 30i and station 412 with arm 26i in module 18i. This process may be reversed in whole or in part to move the substrate(s) in the opposite direction. Thus, in the exemplary embodiment, substrates may be moved in any direction along axis X and to any position along the transport chamber and may be loaded to and unloaded from any desired module (processing or otherwise) communicating with the transport chamber. In other aspects, interstitial transport chamber modules with static substrate supports or shelves may not be provided between transport chamber modules 18B, 18i. In such aspects, transport arms of adjoining transport chamber modules may pass off substrates directly from an end effector of one transport arm to an end effector of another transport arm to move the substrate through the transport chamber. The processing station modules may operate on the substrates through various deposition, etching, or other types of processes to form electrical circuitry or other desired structure on the substrates. The processing station modules are connected to the transport chamber modules to allow substrates to be passed from the transport chamber to the processing stations and vice versa. A suitable example of a processing tool with similar general features to the processing apparatus depicted in FIG. 1D is described in U.S. patent application Ser. No. 11/442,511, previously incorporated by reference in its entirety.

Referring now to FIGS. 2A-2D a transport apparatus 200 is shown in accordance with aspects of the disclosed embodiment. The transport apparatus may include a frame forming a housing 205 and a robot arm 201 connected to the housing 205. While only one robot arm 201 is shown in the FIGS. it should be understood that in other aspects the transport apparatus may include more than one robot arm that may be substantially similar to that described below. The robot arm 201 may include an upper arm 210 rotatably coupled to the housing (or frame) 205 about a shoulder axis of rotation SX, a forearm 220 rotatably coupled to the upper arm 210 about an elbow axis of rotation EX and at least one end effector or substrate holder 230, 231 rotatably coupled to the forearm 220 about a wrist axis of rotation WX. For exemplary purposes only, in this aspect the robot arm is shown as a SCARA (selectively compliant articulated robot arm) robot arm having, e.g., two articulated links with two (or more) end effectors. In other aspects, the robot arm may have more or less than two articulated links and more or fewer end effectors. The upper arm 210 may be a substantially rigid arm link having a proximate end rotatably coupled to the housing 205 and a distal end. The forearm 220 may include stacked or branched forearm section(s) which in one aspect may be referred to for purposes of description, as a generally channel-shaped structure having a lower forearm section 220L and an upper forearm section 220U joined to each other by a connecting member 220B where the lower and upper forearm sections 220L, 220U are spaced apart from one another and positioned substantially aligned with each other. The connecting member 220B may be disposed at a proximate end of the forearm 220 and each of the upper and lower forearm sections 220U, 220L may be joined to the connecting member 220B at a proximate end of the upper and lower forearm sections 220U, 220L. The upper and lower forearm sections 220U, 220L may each extend from the connecting member 220B so that a free end of the upper and lower forearm sections 220U, 220L form a distal end of the forearm 220. The upper and lower forearm sections 220U, 220L may be spaced apart from one another by any suitable distance HF forming a passage within which the one or more end effectors 230, 231 are positioned and through which the end effectors may pass entirely between the upper and lower forearm sections 220U, 220L (e.g. the end effectors may pass through the forearm while holding a substrate or without a substrate). In one aspect, the connecting member 220B may be rigidly connected to respective upper and lower forearm sections 220U, 220L to form a one piece substantially rigid assembly with the upper and lower forearm sections 220U, 220L fixed with respect to each other. In other aspects, the connection member 220B may be rotationally released with respect to one of the upper and lower forearm sections 220U, 220L or both the upper and lower forearm sections 220U, 220L. As may be realized, the two independent end effectors 230, 231 are mounted as will be described further below, to the common forearm 220, with each end effector 230, 231 independently mounted and connected to a corresponding one of the upper and lower forearm sections 220U, 220L (e.g. end effector 231 being mounted to upper forearm section 220U and end effector 230 being mounted to the lower forearm section 220L).

The generally channel-shaped forearm 220 may allow the individual end effectors 230, 231 to have substantially direct routing of wires and pneumatic lines to each end effector 230, 231, via for example, the respective forearm sections, while at the same time allowing the end effectors 230, 231 to be disposed immediately adjacent one another and along a common coaxial wrist axis WX. For example, referring to FIG. 2E the electrical wires/pneumatic lines WH1 for end effector 231 may pass into the forearm 220 through, for example, the elbow joint, pass through the connecting member 220B and into the upper forearm section 220U where the electrical wires/pneumatic lines pass directly to the end effector 231 through the upper wrist joint WJ1 (e.g. without passing through the lower wrist joint WJ2 or end effector 230). It is noted that the independent interconnection between each end effector 230, 231 and the corresponding one of the upper and lower forearm section 220U, 220L includes, for example, electrical wires and pneumatic lines that are provided substantially directly to a respective one of the first and second end effectors from the forearm independent of electrical wire and pneumatic line routing for the other one of the first and second end effector. Similarly, the electrical wires/pneumatic lines WH2 for end effector 230 may pass into the forearm 220 through, for example, the elbow joint and into the lower forearm section 220L where the electrical wires/pneumatic lines pass directly to the end effector 230 through the lower wrist joint WJ2. It is noted that to allow infinite rotation of the end effectors 230, 231 about the wrist axis WX slip seals and slip rings may be provided at the upper and lower wrist joints WJ1, WJ2 with respect to the electrical and pneumatic connections between the forearm 220 and the end effectors 230, 231. As may be realized, the exemplary configurations of the aspects of the disclosed embodiment decouples spacing between the stacked independent end effectors 230, 231 mounted to the common forearm 220, from a height build up between end effectors accommodating pass through instrumentation (which may include e.g. the electrical wires and pneumatic lines) and there between.

In one aspect, an end effector 230 may be rotatably coupled to the distal end of the lower forearm section 220L about the wrist axis WX and end effector 231 may be rotatably coupled to the distal end of the upper forearm section 220U about the wrist axis WX so that the end effectors 230, 231 are mounted in an opposing relationship between the upper and lower forearm sections 220U, 220L. While only one end effector is shown coupled to each of the upper and lower forearm sections 220U, 220L, it should be understood that in other aspects any suitable number of end effectors may be coupled to each of the upper and lower forearm sections 220U, 220L in any suitable manner. The end effectors may be any suitable type of end effector configured to hold one or more substrates W1, W2. For example, the end effectors may be active gripping or passive gripping; the end effectors may include any suitable sensors such as substrate mapping sensors or other suitable substrate detection sensors. Suitable examples of end effectors can be found in, for example, U.S. Pat. Nos. 6,256,555; 6,438,460; 6,453,214; 7,712,808; and U.S. patent application Ser. No. 11/741,416 filed on Apr. 27, 2007 and entitled "Inertial Wafer Centering End Effector and Transport Apparatus," the disclosures of which are incorporated by reference herein in their entireties. The end effectors 230, 231 may also allow a fast swapping of substrates to and from any suitable substrate holding location accessible by the transport apparatus 200.

The housing 205 may include or otherwise house a drive section 250. The drive section 250 may include at least one motor 250M for driving one or more arm links (e.g. the upper arm 210, forearm 220 or end effectors 230, 231) of the transport apparatus 200 in any suitable manner. Suitable drive motors may be found in, for example, U.S. Pat. No. 5,720,590; U.S. patent application Ser. No. 12/163,996 filed on Jun. 27, 2008 (entitled "Robot Drive with Magnetic Spindle Bearings") and Ser. No. 13/270,844 filed on Oct. 11, 2011 (entitled "Coaxial Drive Vacuum Robot"); and U.S. Provisional patent application No. 61/510,819 filed on Jul. 22, 2011 (entitled "Compact Drive Spindle"), the disclosures of which are incorporated herein by reference in their entireties. In other aspects the drive section 250 may include any suitable drive motor(s). For example, as will be described in greater detail below, in one aspect as will be described below, the drive section 250 may be a distributed drive section such that one or more motors are located about a respective drive axis of rotation (e.g. the shoulder axis SX, elbow axis EX and wrist axis WX) for driving the arm links. In other aspects, the drive section may include a coaxial drive spindle arrangement and corresponding motors disposed substantially within the housing 205 for driving the arm links. In still other aspects one or more motors may be located at least partly within the upper and lower forearm sections 220U, 220L.

Still referring to FIGS. 2A-2D, the drive section 250 may be a distributed drive section where the motors 250M, 251, 252, 253 for driving each one of the arm links (e.g. upper arm 210, forearm 220 and end effectors 230, 231) may be disposed substantially about, or otherwise adjacent to, the axis of rotation for that arm link (e.g. axis SX, EX, WX). For example, the housing 205 may include a motor 250M for rotatably driving the upper arm about axis SX. The housing 205 may also include or be connected to any suitable Z-drive 250MZ configured to move the end effectors 230, 231 (and/or the robot arm 201 as a unit) in the direction of arrow Z, which may be in a direction substantially perpendicular to a plane of extension and retraction of the robot arm 201. The motor 250M may be drivingly coupled to the upper arm 210 in any suitable manner, such as substantially directly or through any suitable transmission, for causing rotation of the upper arm about the shoulder axis SX. The drive section may also include a forearm drive unit 253 that may be disposed substantially at the distal end of the upper arm substantially about the elbow axis EX. The forearm drive unit 253 may be configured to substantially directly drive/rotate the forearm 220 about the elbow axis. In other aspects the forearm drive unit 253 may drivingly rotate the forearm 220 through any suitable transmission. An end effector drive unit 251, 252 may be disposed on each of the upper and lower forearm sections 220U, 220L for driving/rotating a respective one of the end effectors 230, 231 substantially directly or, in other aspects, through any suitable transmission. As may be realized, each of the end effector drive units 251, 252 may allow for rotation of a respective end effector 230, 231 substantially independently of the other end effector 230, 231. In one aspect, the end effector drive units 251, 252 may also be configured with Z-movement capability for moving the end effectors in the direction of arrow Z.

Referring to FIGS. 2F and 2G, in accordance with an aspect of the disclosed embodiment, the end effector drive units 251, 252 may be located on stacked or branched forearm sections, e.g., the upper and/or lower forearm sections 220U, 220L. In this aspect the end effector drive unit 251 for driving end effector 230 is located at least partly within the lower forearm section 220L and the end effector drive unit 252 for driving the end effector 231 is located at least partly within the upper forearm section 220U. In other aspects both end effector drive units 251, 252 may be located in the upper forearm section 220U or both end effector drive units 251, 252 may be located in the lower forearm section 220L. As may be realized, the end effectors 230, 231 may be rotatably mounted about the wrist axis WX. In one aspect the end effector drive units are disposed in the forearm and offset from both of the elbow axis EX and wrist axis WX. Driven pulleys 251P2, 252P2 may be rotatably mounted about the wrist axis and coupled to a respective end effector 230, 231 so that as a driven pulley 251P2, 252P2 rotates the respective end effector 230, 231 rotates with it. For example, end effector 230 may be coupled in any suitable manner to driven pulley 251P2 so that both the end effector 230 and pulley 251P2 rotate in unison about the wrist axis WX. Similarly, end effector 231 may be coupled in any suitable manner to driven pulley 252P2 so that both the end effector 231 and pulley 252P2 rotate in unison about the wrist axis WX. A drive pulley 252P1, 252P1 may be coupled to an output shaft of a respective end effector drive unit 251, 252 so that as the output shaft rotates the drive pulley 251P1, 252P2 rotates with it. The drive pulleys 251P1, 252P1 may be connected to their respective driven pulleys 251P2, 252P2 in any suitable manner such as by, e.g., belts or bands. In one aspect the one or more suitable bands 297, 298 may connect the drive pulleys 251P1, 252P1 to their respective driven pulleys 251P2, 252P2. For example, one or more bands 298 may connect the drive pulley 251P1 to the driven pulley 251P2 so that when the end effector drive unit 251 rotates the drive pulley 251P1, the one or more bands 298 cause rotation of the end effector 230. Similarly, one or more bands 297 may connect the drive pulley 252P1 to the driven pulley 252P2 so that when the end effector drive unit 252 rotates the drive pulley 252P1, the one or more bands 297 cause rotation of the end effector 231. Suitable examples of bands 297, 298 can be found in U.S. provisional patent application No. 61/869,870 entitled "Substrate Transport Apparatus" and filed on Aug. 26, 2013 and U.S. Pat. No. 5,778,730 issued Jul. 14, 1998, U.S. Pat. No. 5,908,281 issued Jun. 1, 1999, and U.S. Pat. No. 5,954,472 issued Sep. 21, 1999 the disclosures of which are incorporated herein by reference in their entireties.

Figure 2A:
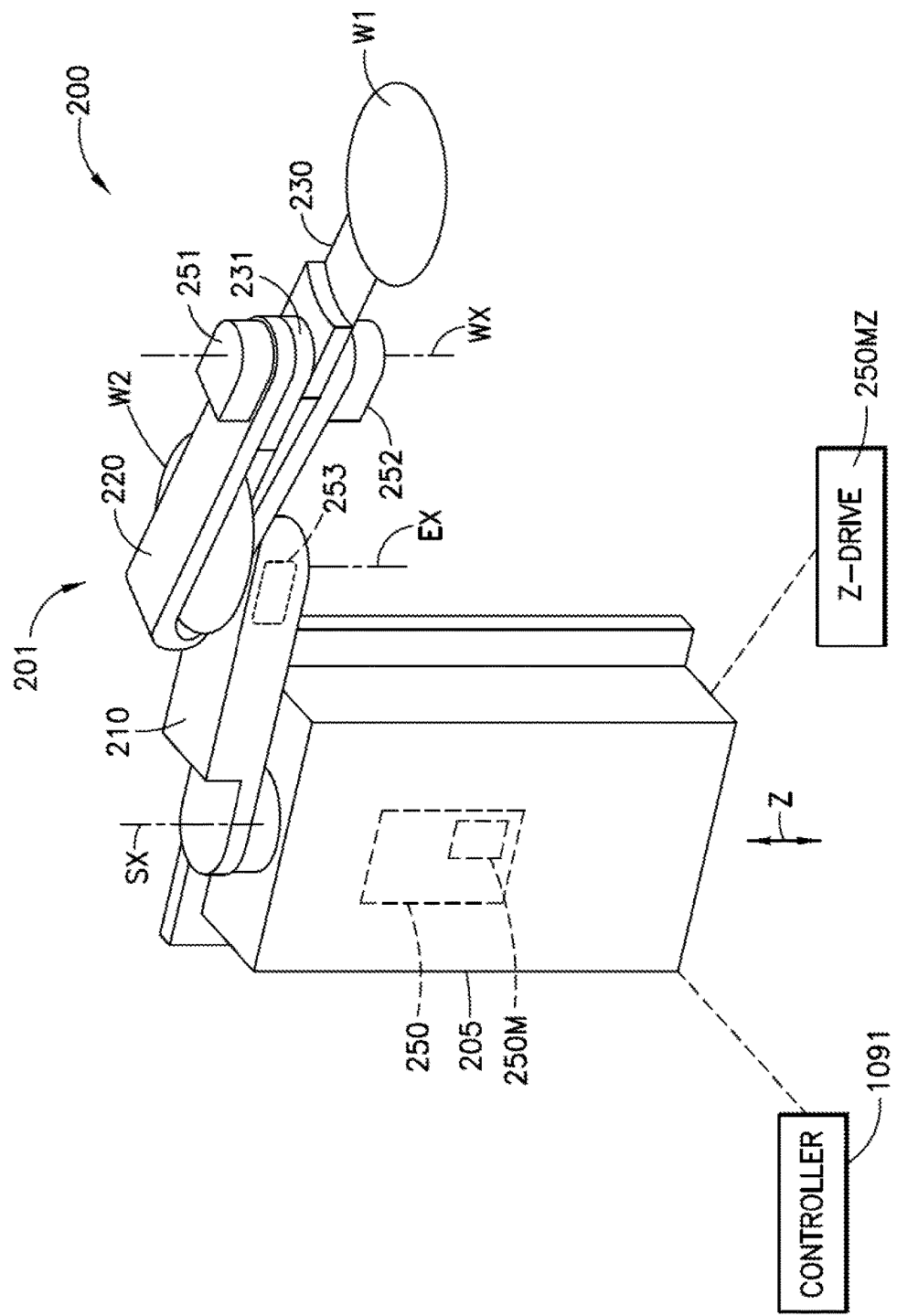
Figure 2E:
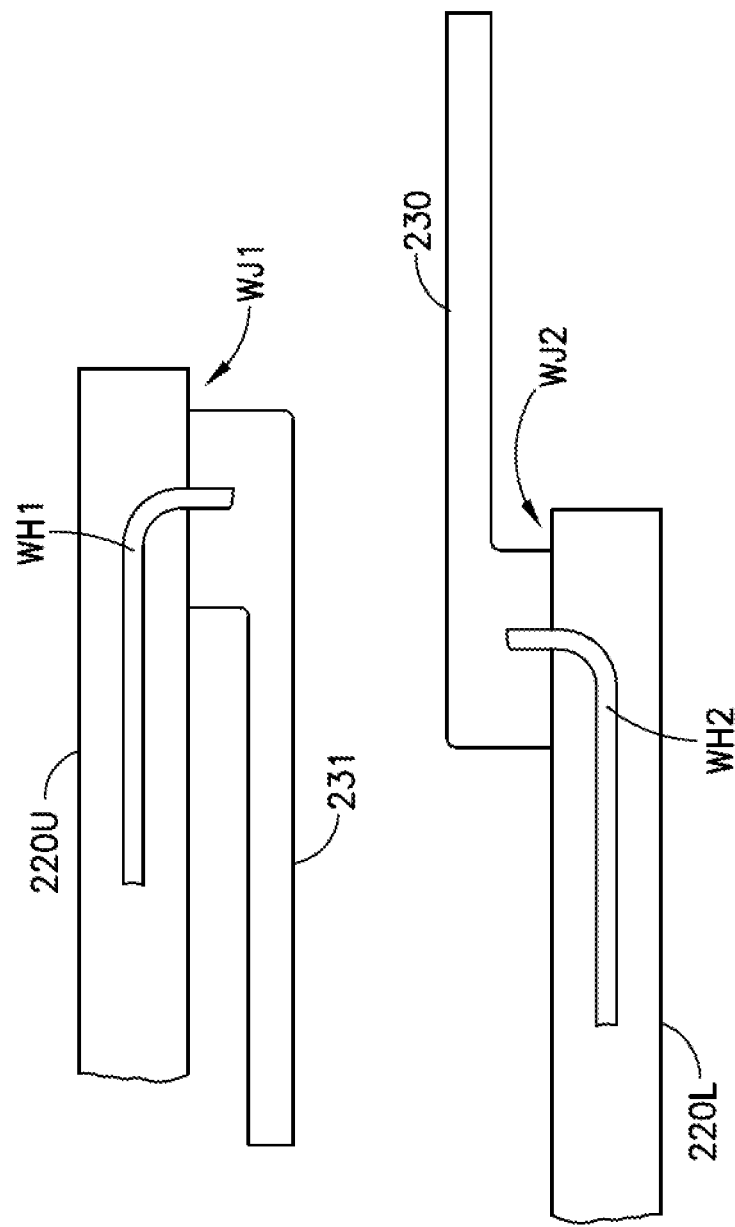
FIG. 2E is a schematic illustration of a portion of a substrate transport apparatus in accordance with aspects of the disclosed embodiment.
Figure 3A:
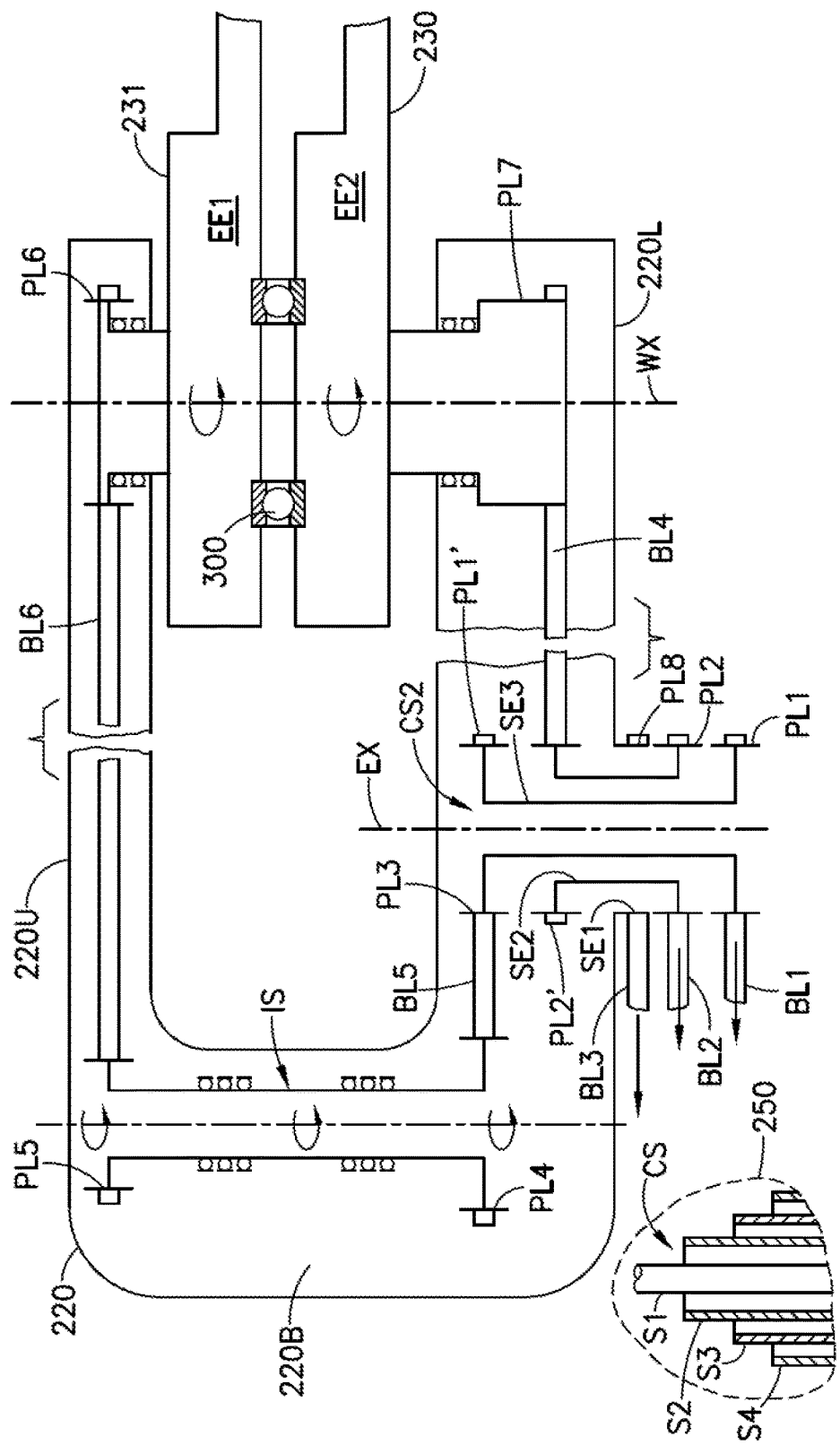
FIGS. 3A, 3B and 3C are schematic illustrations of portions of a substrate transport apparatus in accordance with aspects of the disclosed embodiment.

Referring now to FIGS. 2A and 3A, in one aspect of the disclosed embodiment, the drive section 250 may include a coaxial drive shaft arrangement CS where each drive shaft S1, S2, S3, S4 is driven by a respective motor in any suitable manner, such as for example, substantially directly or through any suitable transmission. In this aspect the motors for driving the upper arm 210, forearm 220 and end effectors 230, 231 may be disposed substantially within the housing 205. Here the upper arm 210 may be coupled to drive shaft S4 in any suitable manner for rotatably driving the upper arm 210 about shoulder axis SX. A coaxial drive shaft arrangement CS2 may also be disposed at the elbow axis EX for facilitating the rotation of the forearm 220 and end effectors 230, 231. The coaxial shaft arrangement CS2 may include shafts SE1, SE2, SE3. Shaft SE1 may be drivingly coupled to the forearm 220 for rotating the forearm 220 about the elbow axis EX. Shaft SE1 may be coupled to, for example, drive shaft S1 through any suitable transmission, such as through belt BL3 and pulleys PL8. Shaft SE2 may include a drive pulley PL2 and a driven pulley PL2'. Drive pulley PL2 may be coupled to drive shaft S2 through any suitable transmission such as through belt BL2 for driving shaft SE2. Shaft SE3 may also include a drive pulley PL1 and a driven pulley PL1' where drive pulley PL1 may be coupled to drive shaft SE3 through any suitable transmission such as through belt BL1 for driving shaft SE3. End effector 230 may be rotatably mounted to the lower forearm section 220L about axis WX by shaft/pulley arrangement PL7. The shaft/pulley arrangement PL7 may be coupled to driven pulley PL2' in any suitable manner such as by, for example, belt BL4 for drivingly rotating end effector 230 about the wrist axis WX. End effector 231 may be rotatably mounted to the upper forearm section 220U about axis WX by shaft/pulley arrangement PL6. The shaft/pulley arrangement PL6 may be connected to driven pulley PL1' in any suitable manner such as by, intermediary shaft IS. The intermediary shaft IS may be disposed within the connecting member 220B and include pulleys PL4, PL5 such that pulley PL4 is coupled to shaft SE3 by, for example, belt BL5 and pulley PL5 is coupled to the shaft/pulley arrangement PL6 by, for example, belt BL6. As can be seen in FIG. 3A each of the upper arm 210, forearm 220 and end effectors 230, 231 are independently rotatable about their respective axes of rotation SX, EX, WX. As can also be seen in FIG. 3A, in accordance with aspects of the disclosed embodiment a shared bearing 300 may be disposed between the end effectors 230, 231 so that at least the distal end of the upper forearm section 220U is not cantilevered from the connecting member 220B. In one aspect, the bearing 300 may be any suitable bearing that may allow for substantially independent rotation of the end effectors 230, 231. In other aspects, where the end effectors 230, 231 are coupled to each other for rotation as a unit, the bearing 300 may be any suitable coupling member. As may be realized, connecting the distal ends of the upper and lower forearm sections 220U, 220L through, for example, shared bearing 300 may provide a substantially rigid structure for mounting the end effectors 230, 231.

Figure 3B:
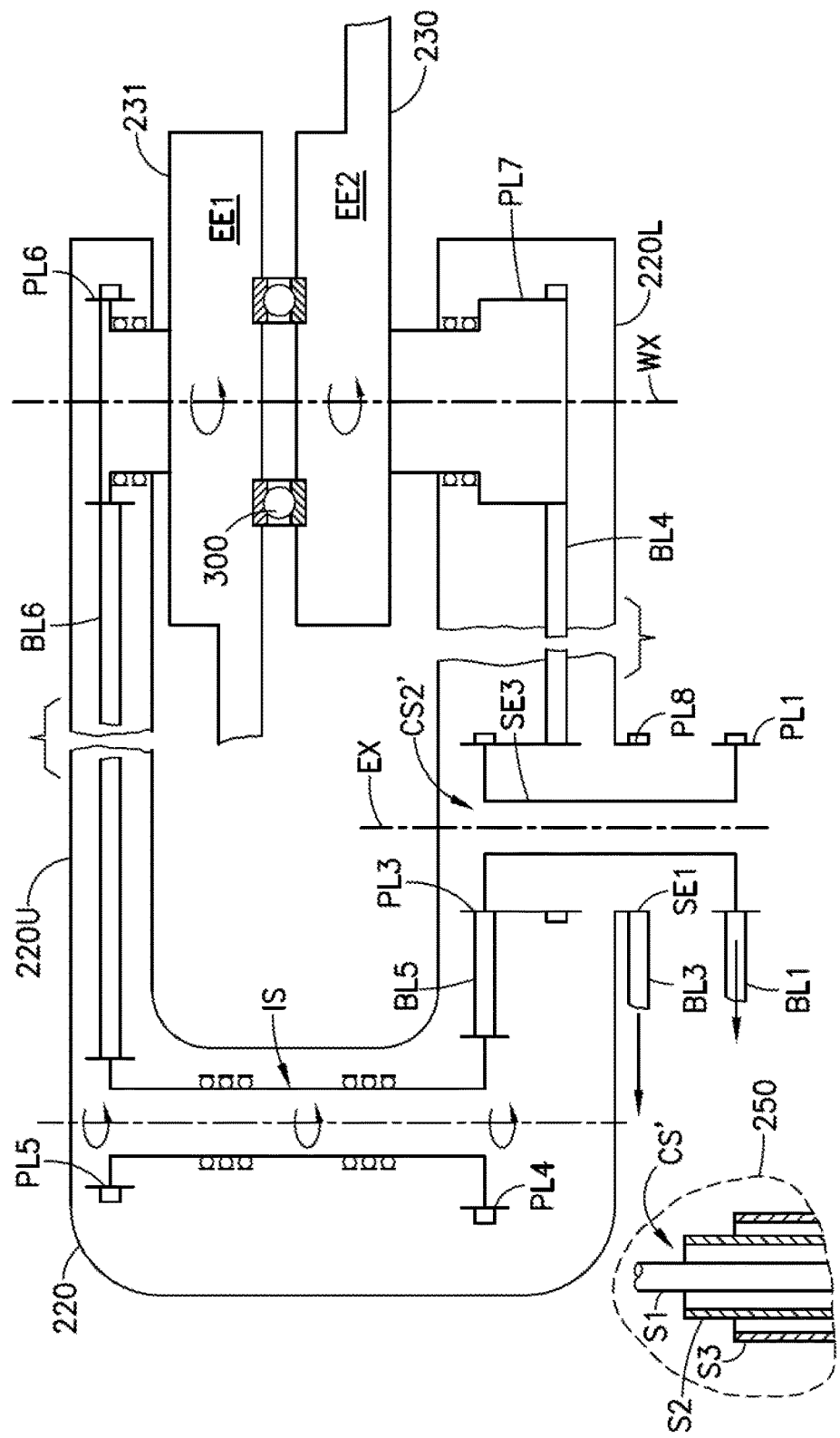

Referring to FIGS. 2A and 3B the robot arm 201 may be configured so that the end effectors 230, 231 are coupled to each other so that the end effectors 230, 231 rotate about the wrist axis WX as a unit. In this aspect the drive section 250 includes a coaxial drive shaft arrangement CS' substantially similar to coaxial drive shaft arrangement CS, however in this aspect the coaxial drive arrangement CS' includes drive shafts S1, S2, S3. Each drive shaft S1, S2, S3 is driven by a respective motor in any suitable manner, such as for example, substantially directly or through any suitable transmission. In this aspect the motors for driving the upper arm 210, forearm 220 and end effectors 230, 231 may be disposed substantially within the housing 205. Here the upper arm 210 may be coupled to drive shaft S3 in any suitable manner for rotatably driving the upper arm 210 about shoulder axis SX. A coaxial drive shaft arrangement CS2' may also be disposed at the elbow axis EX for facilitating the rotation of the forearm 220 and end effectors 230, 231. The coaxial shaft arrangement CS2 may include shafts SE1, and SE3. Shaft SE1 may be drivingly coupled to the forearm 220 for rotating the forearm 220 about the elbow axis EX. Shaft SE1 may be coupled to, for example, drive shaft S1 through any suitable transmission, such as through belt BL3 and pulleys PL8. The shaft SE3 may include a drive pulley PL1 and driven pulley PL3. The drive pulley PL1 may be coupled to the drive shaft S2 in any suitable manner, such as through belt BL1. The driven pulley PL3 may be coupled to both end effectors 230, 231 so that both end effectors 230, 231 are driven by a common drive of the drive section 250. In this aspect, pulley PL3 may be coupled to shaft/pulley arrangement PL7 in any suitable manner, such as by belt BL4. Pulley PL3 may also be coupled to shaft/pulley arrangement PL6 in any suitable manner, such as by intermediary shaft IS in a manner substantially similar to that described above so that as end effector 230 is rotated about axis WX, end effector 231 also rotates about axis WX in the same direction and substantially at the same speed.

As may be realized, while the coaxial drive shaft arrangement CS, CS' are illustrated and described as being disposed within the housing 205 it should be understood that the coaxial drive shaft arrangement may be disposed at any suitable location along the robot arm 201 and configured to drive any suitable combination of the upper arm 210, forearm 220 and end effectors 230, 231. In addition to the aspects of the disclosed embodiment described above, the drive section 250 may include a coaxial drive shaft arrangement having two drive shafts disposed substantially within the housing 205 where one of the drive shafts drivingly rotates the upper arm and the other drive shaft drivingly rotates the forearm through any suitable transmission (such as in the manner described above). In another aspect, drive motor 253, which may be disposed about or adjacent to the elbow axis EX, may include a coaxial or other motor arrangement (e.g. substantially similar to that described above with respect to drive shaft arrangements SC, Sc') for substantially directly driving the coaxial shafts SE1, SE2, SE3 of FIG. 3A or the coaxial shafts SE1, SE3 of FIG. 3B.

Figure 3C:
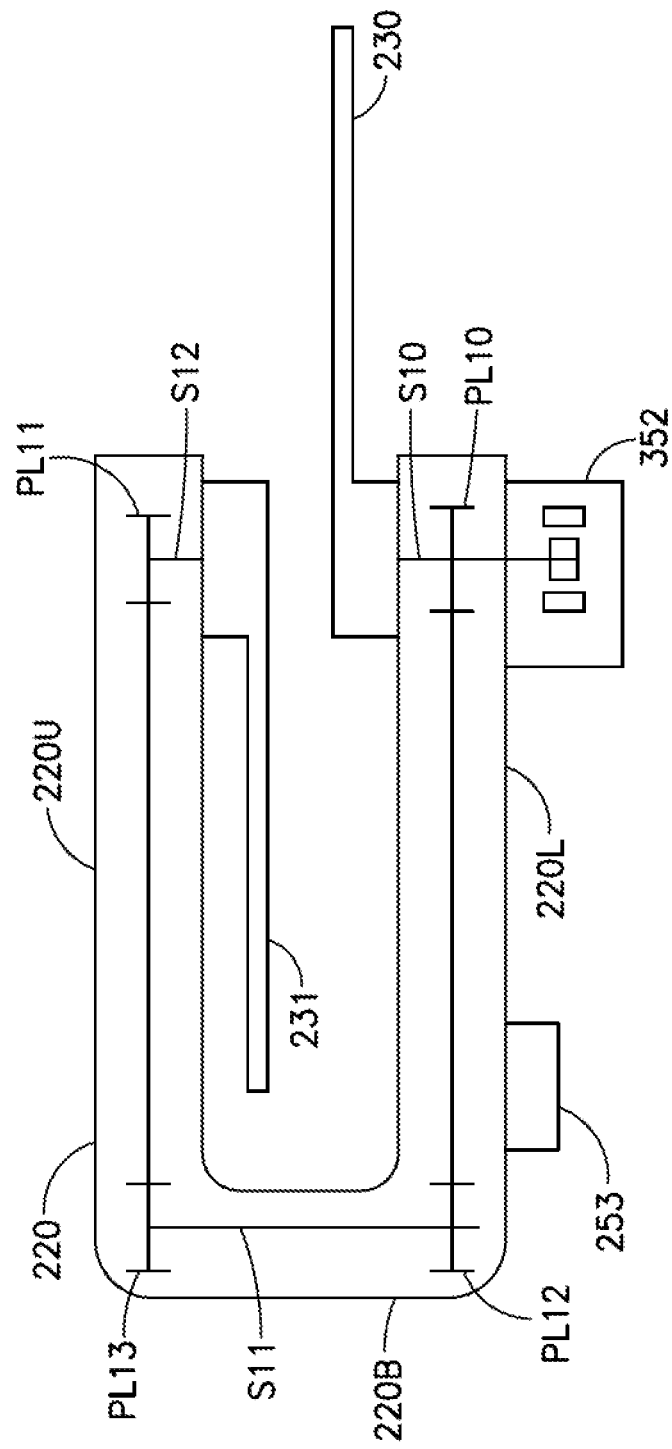

Referring to FIG. 3C, in another aspect of the disclosed embodiment, the end effectors may be driven by a common drive motor 352 that may be disposed on either of the upper or lower forearm sections 220U, 220L about the wrist axis WX. The motor 352 is shown connected to the lower forearm section 220L in FIG. 3C for exemplary purposes only. It is noted that in this aspect the forearm 220 may be driven in any suitable manner such as through a motor 253 disposed about or adjacent to the elbow axes EX or through a belt and pulley arrangement as described above with respect to FIGS. 3A and 3B. Here the end effector 230 may be substantially directly coupled to the drive motor 352 in any suitable manner, such as by shaft S10. The shaft S10 may include a pulley PL10 that is coupled to the shaft so that as the shaft rotates the pulley rotates with it. The end effector 231 may be coupled to a shaft S12 which has pulley PL11 coupled thereto. The pulleys PL10 and PL11 may be coupled to each other through intermediary shaft S11 in a manner substantially similar to that described above, where pulley PL10 is coupled to pulley PL12 of intermediary shaft by a belt (or other suitable transmission) and pulley PL11 is coupled to pulley PL13 of intermediary shaft S11 by a belt (or other suitable transmission). In still other aspects, where the end effectors 230, 231 are to be rotated as a unit, the bearing 300 may fixedly couple the end effectors 230, 231 so that the end effectors 230, 231 may be substantially directly driven by a single motor without a multi-shaft transmission (as shown in FIGS. 3A-3C) disposed within the forearm 220.

Figure 4:
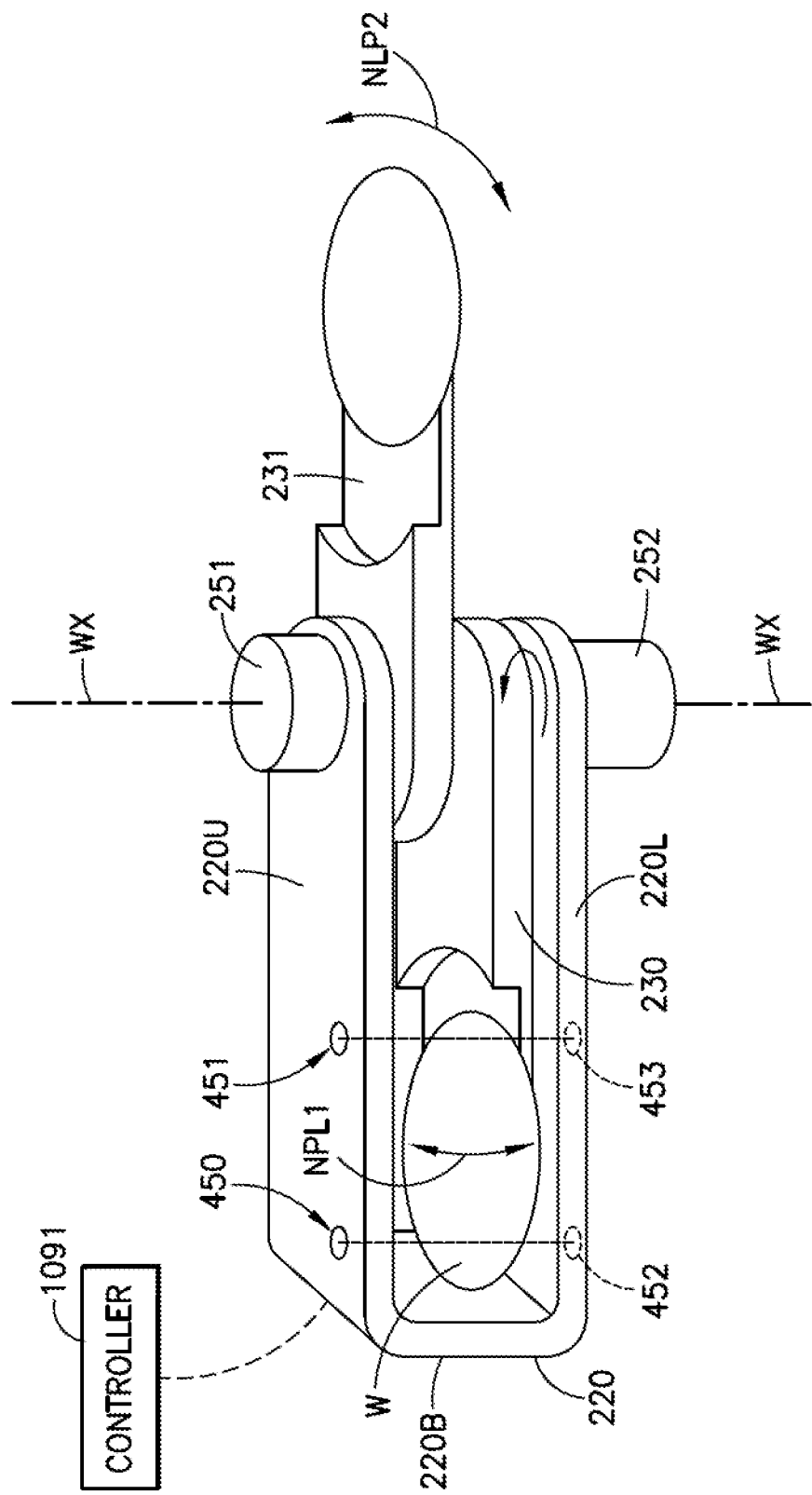
FIG. 4 is a schematic illustration of a portion of a substrate transport apparatus in accordance with an aspect of the disclosed embodiment.

Referring now to FIG. 4, the generally channel-shaped forearm 220 may also be configured for automatic wafer centering such that the generally channel-shaped forearm 220 forms a rotational pass-through for a wafer positioning/centering sensor. In one aspect, wafer centering sensors 450, 452 and 451, 453 may be disposed on the forearm for sensing substrates W (which are held on end effectors 230, 231) as the substrates are rotated about the wrist axis WX and pass between the upper and lower forearm sections 220U, 220L. The wafer centering sensors are shown in FIG. 4, for exemplary purposes only, as through beam sensors having light emitters 450, 451 disposed on the upper forearm section 220U and light detectors 452, 453 disposed on the lower forearm section 220L (or vice versa). In other aspects the wafer centering sensors may be any suitable sensors such as, for example, reflective sensors, capacitive sensors, inductive sensors, or any other sensor capable of detecting the presence of and/or the edge of the substrates W as the substrates pass between the upper and lower forearm sections 220U, 220L. In this aspect, the substrates W are passed through the sensors 450, 452 and 451, 453 by rotating (e.g. about the wrist axis WX) the end effector 230, 231 holding the substrate W so that the end effector 230, 231 and the substrate W thereon passes between the upper and lower forearm sections 220U, 220L. The sensors 450, 452 and 451, 453 may be connected to any suitable controller, such as controller 1091 so that as, for example, the edges of the substrate W are detected by the sensors suitable signals are sent to the controller for calculating (in any suitable manner) the center position of the substrate W relative to, for example, the end effector 230, 231, or any other suitable feature/component of the substrate processing equipment, so that a position of the robot arm 201 may be adjusted as the substrate is placed to a substrate holding location for placing the substrate at a predetermined position at the substrate holding location. Although it should be understood that the data/signals obtained by the sensors 450, 452 and 451, 453 would be processed to compensate for the non-linear path NLP1, NLP2 taken by the substrates W, suitable examples of wafer centering sensors and algorithms can be found in, for example, U.S. Pat. No. 7,925,378 issued Apr. 12, 2011, U.S. Pat. No. 7,859,685 issued Dec. 28, 2010, U.S. Pat. No. 8,270,702 issued Sep. 18, 2012, U.S. Pat. No. 7,894,657 issued Feb. 22, 2011, U.S. Pat. No. 8,125,652 issued Feb. 28, 2012, U.S. Pat. No. 8,253,948 issued Aug. 28, 2012, U.S. Pat. No. 8,634,633 issued Jan. 21, 2014, U.S. Pat. No. 7,792,350 issued Sep. 7, 2010, U.S. Pat. No. 7,880,155 issued Feb. 1, 2011, and U.S. Pat. No. 6,990,430 issued Jan. 24, 2006 the disclosures of which are incorporated herein by reference in their entireties.

Figure 5A:
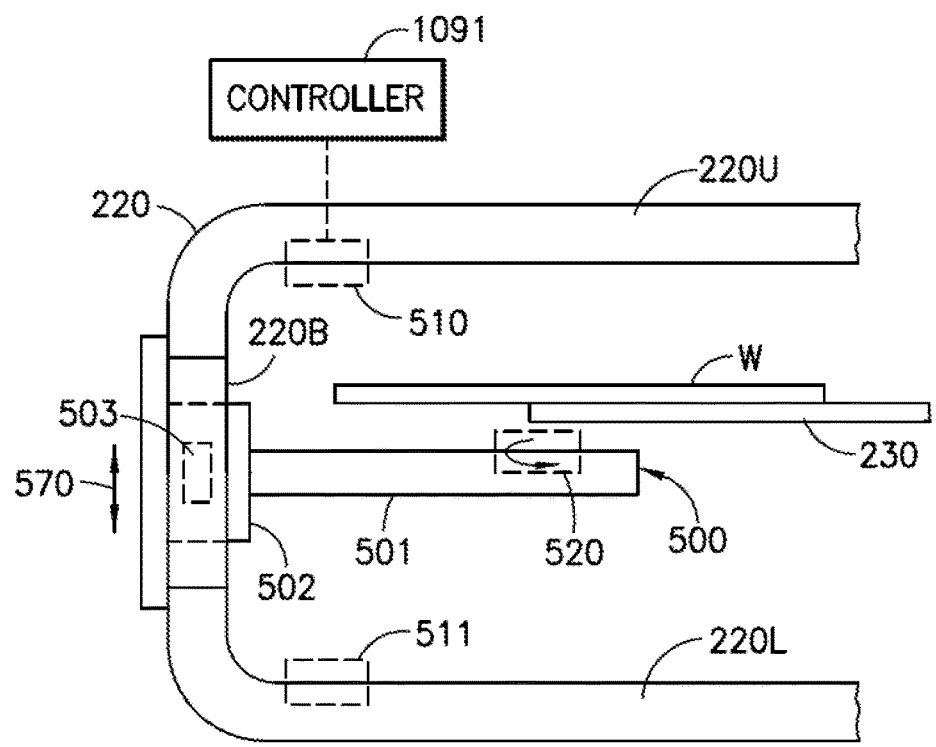
FIGS. 5A and 5B are schematic illustrations of a portion of a substrate transport apparatus in accordance with an aspect of the disclosed embodiment.
Figure 5B:
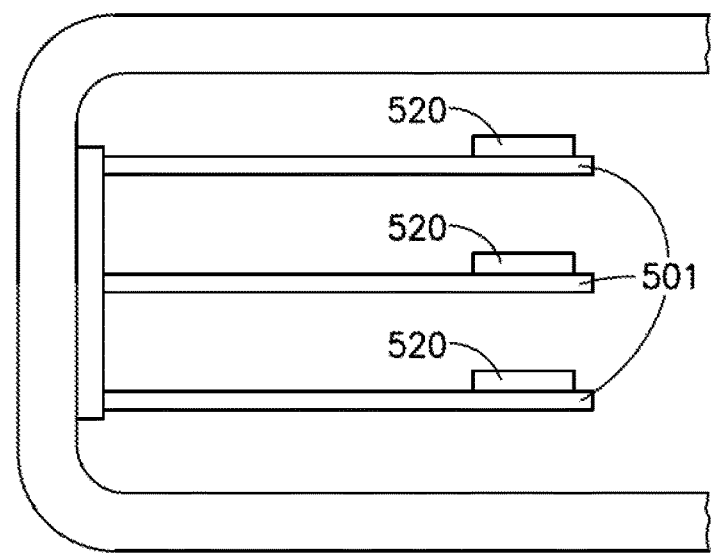

FIG. 5A illustrates the incorporation of a substrate aligner 500 (e.g. for aligning the substrate to a predetermined orientation) on the robot arm 201 in accordance with the aspects of the disclosed embodiment. The substrate aligner 500 may include a base or substrate support 501, a substrate holder 520 mounted to the base 501 and at least one sensor 510, 511 configured to detect any suitable substrate alignment feature (e.g. such as a notch or flat). The base may be mounted to, for example, the connecting member 220B of the forearm 220 so that the base is substantially cantilevered from the connecting member 220B and the substrate holder 520 is disposed between the upper and lower forearm sections 220U, 220L. In one aspect the base 501 may be movably mounted to the connecting member 220B in any suitable manner such as by, for example, a slide 502 configured to allow movement of the direction of arrow 570. In one aspect, any suitable linear drive mechanism 503 may be connected to the slide 502 for linearly driving the slide 502 in the direction of arrow 570. The drive mechanism may be disposed at least partially within the connecting member 220B or at any other suitable location and be connected to the slide substantially directly or through any suitable transmission. The substrate holder 520 may be rotatably mounted to the base 501 and be configured to interact with the end effectors 230, 231 for transferring substrate to and from the end effectors 230, 231. The movement of the base 501 in the direction of arrow 570 may lift/place substrate from/to the end effectors 230, 231. In other aspects, such as where the base 501 is stationarilly mounted to the connecting member 220B, the end effectors, as described above, may be capable of moving in the direction of arrow 570 for lifting/placing substrate from/to the aligner 500. The at least one sensor 510, 511 is shown in FIG. 5 as a through beam sensor having a light emitter 510 and a light detector 511 but in other aspects the sensor may be any suitable sensor such as a reflective sensor, capacitive sensor, inductive sensor or any other suitable sensor capable of detecting the alignment feature of the substrate W. In this aspect the light emitter 510 is disposed on the upper forearm section 220U and the light detector 511 is disposed on the lower forearm section 220L but in other aspects the light emitter 510 and light detector 511 may be disposed in any suitable locations for detecting the alignment feature of the substrate W. In operation, the substrate W is transferred to the aligner 500 through rotation of the end effector 230, 231 so that the substrate is substantially aligned with the substrate holder 520 and the movement of the base 501 and/or end effector 230, 231 in the direction of arrow 570. The substrate holder 520 may grip the substrate in any suitable manner for rotating the substrate W and allowing the at least one sensor 510, 511 to sense, for example, the peripheral edge, of the substrate. The at least one sensor 510, 511 may be connected to any suitable controller, such as controller 1091, so that as the substrate W is rotated by the substrate holder 520, the substrate alignment feature may be detected by the sensor 510, 511 and a suitable signal is sent to the controller indicating the position of the substrate alignment feature. The controller 1091 may then effect rotation of the substrate holder 520 to place the substrate alignment feature in a predetermined orientation for aligning the substrate. The substrate W may be transferred to the one of the end effectors 230, 231 post alignment in a manner substantially similar to that described above with respect to the transfer of the substrate W to the aligner 500. It is noted that while only one base 501 and substrate holder 520 are shown in FIG. 5A, in other aspects, as shown in FIG. 5B, the aligner may include two or more stacked or branched bases 501 where each base includes a respective substrate holder 520. The stacked bases and their corresponding substrate holder 520 may allow for a multiple substrate aligner capable of aligning multiple substrates In other aspects of the disclosed embodiment the aligner 500 may also be configured to serve as a substrate buffer such that substrates W may be, for example, temporarily stored on the base(s) 501. In still other aspects the substrate holder 520 may be fixedly mounted to a respective base 501 such that only one or more substrate buffers are provided. In yet other aspects, the base(s) 501 and substrate holder(s) 520 may be configured to provide any suitable combination of substrate aligner and buffer locations between the upper and lower forearm sections 220U, 220L.

Figure 5C:
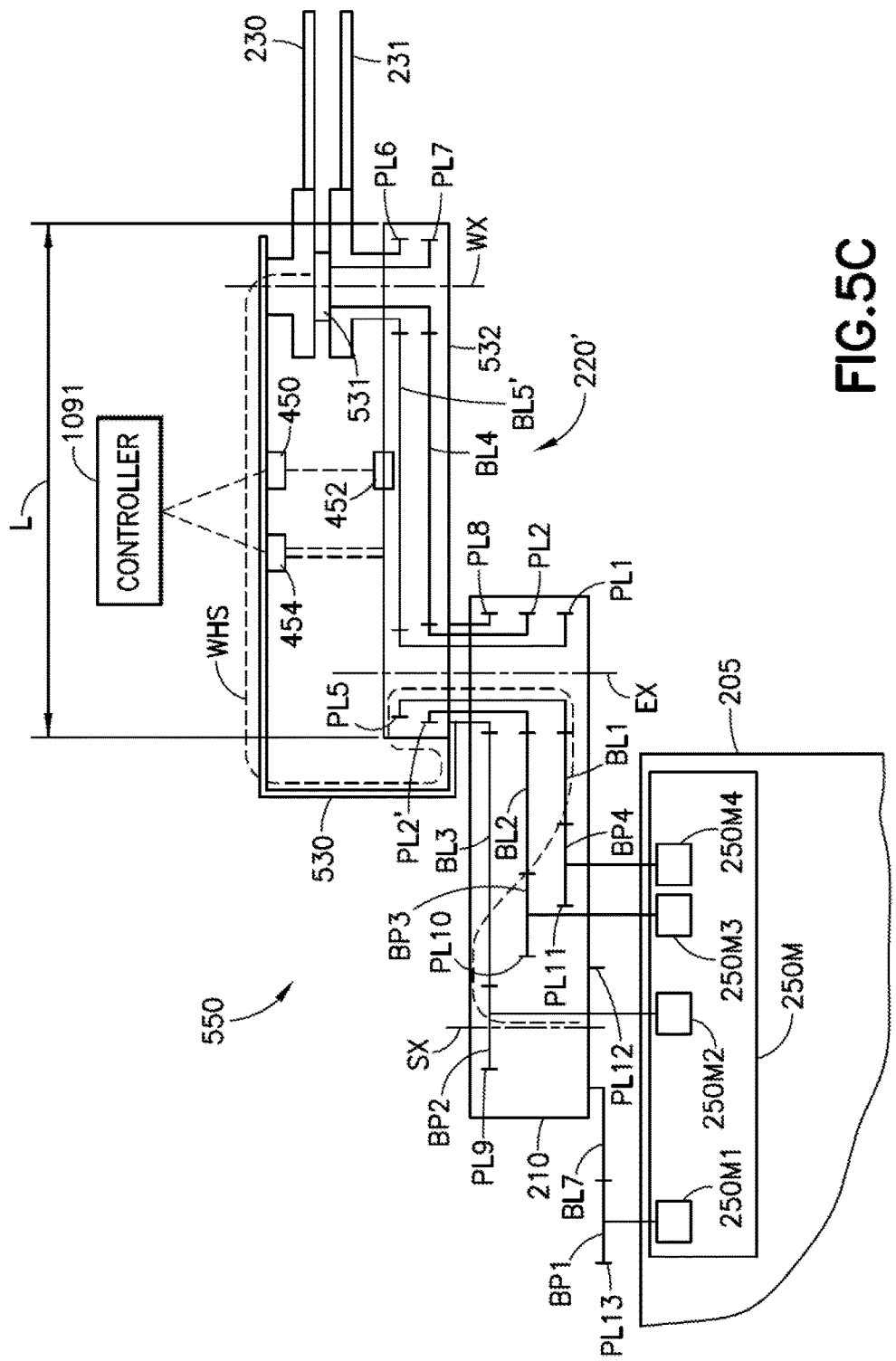
FIGS. 5C and 5D are schematic illustrations of a portion of a substrate transport apparatus in accordance with an aspect of the disclosed embodiment.

In other aspects of the disclosed embodiment, FIG. 5C illustrates a dual yaw robot arm with exterior pass through instrumentation routing 550. The dual yaw robot arm with exterior pass through instrumentation routing 550 is substantially similar to those described herein and includes a housing 205, an upper arm 210, a stacked or branched forearm section 220', and independent stacked end effectors 230, 231. The upper arm 210, stacked or branched forearm section 220', and independent stacked end effectors 230, 231 are driven by at least one motor 250M in any suitable manner. In one aspect, the motor 250M includes more than one motor arranged coaxially or side by side. In this aspect, for exemplary purposes, the upper arm 210 is driven by motor 250M1, the stacked forearm section 220' is driven by 250M2, and the independent stacked end effectors are driven by motors 250M3 and 250M4. As previously described herein, each motor 250M1, 250M2, 250M3, 250M4 drives a respective belt and pulley system BP1, BP2, BP3, BP4, which include respective pulleys PL1, PL2, PL2', PL5, PL6, PL7, PL8, PL9, PL10, PL11, PL12, PL13 and belts BL1, BL2, BL3, BL4, BL5', BL7, that are coupled to each respective arm section 210, 220' or end effector 230, 231 and allows the arm sections 210, 220' and end effectors 230, 231 to rotate around a respective one of the shoulder axis SX, elbow axis EX, and wrist axis WX. In one aspect the motors 250M1 and 250M2 can be located in the housing 205 while motors 250M3 and 250M4 are located in the upper arm 210. In another aspect the motors 250M2, 250M3, and 250M4 may be located in the upper arm 210 while motor 250M1 remains in the housing 205. In another aspect, the motors 250M3 and 250M4 may be located in the stacked forearm section 220' while motor 250M1 remains in the housing 205 and motor 250M2 is located in at least one of the housing 205 or upper arm 210. As may be realized, the motors 250M1, 250M2, 250M3, 250M4 may be located in any suitable portion of the dual yaw robot arm for driving a respective arm link and/or end effector. In one aspect, stacked forearm section 220' includes a base arm member 532 and a support member 530 configured with the pass through instrumentation routing 550 for routing wires and/or hoses WHS corresponding to end effector control features of the independent stacked end effectors 230, 231 or sensory components such as for wafer centering. The wires and/or hoses WHS are used, in one aspect, to control gripping members or any other actuated mechanism disposed on the end effectors 230, 231. As may be realized, the terms wires and hoses are generalized terms that refer to, for example, any suitable electrical lead and/or fluid conduit such as electrical wires and pneumatic/vacuum hoses. In this aspect the wire/hoses WHS are mounted on and/or pass through the support member 530.

In one aspect, the support member 530 includes any suitable substantially rigid support structure such as, tubing, piping, a bracket or a platform. The support member 530 is coupled to any suitable portion of the base arm member 532 such as, at the elbow joint so as to rotate with the base arm member 532 about the elbow axis EX as a unit. The support member 530 extends along at least a portion of a length L of the base arm member 532. As may be realized, the wires/hoses WHS are routed from the upper arm 210 along and/or through the support member 530 and/or base arm member 532 to the end effectors 230, 231. A rotating electrical connector, rotating fluidic union, wiring flex coil, or any other suitable rotary coupling 531 is disposed between the end effectors 230, 231 to allow the wires/hoses WHS (or at least a connection/coupling therebetween) to freely pass between the end effectors 230, 231. As may be realized, the aspects of the disclosed embodiment may allow the wrist axis WX to be free from slip ring transmissions.

Figure 5D:
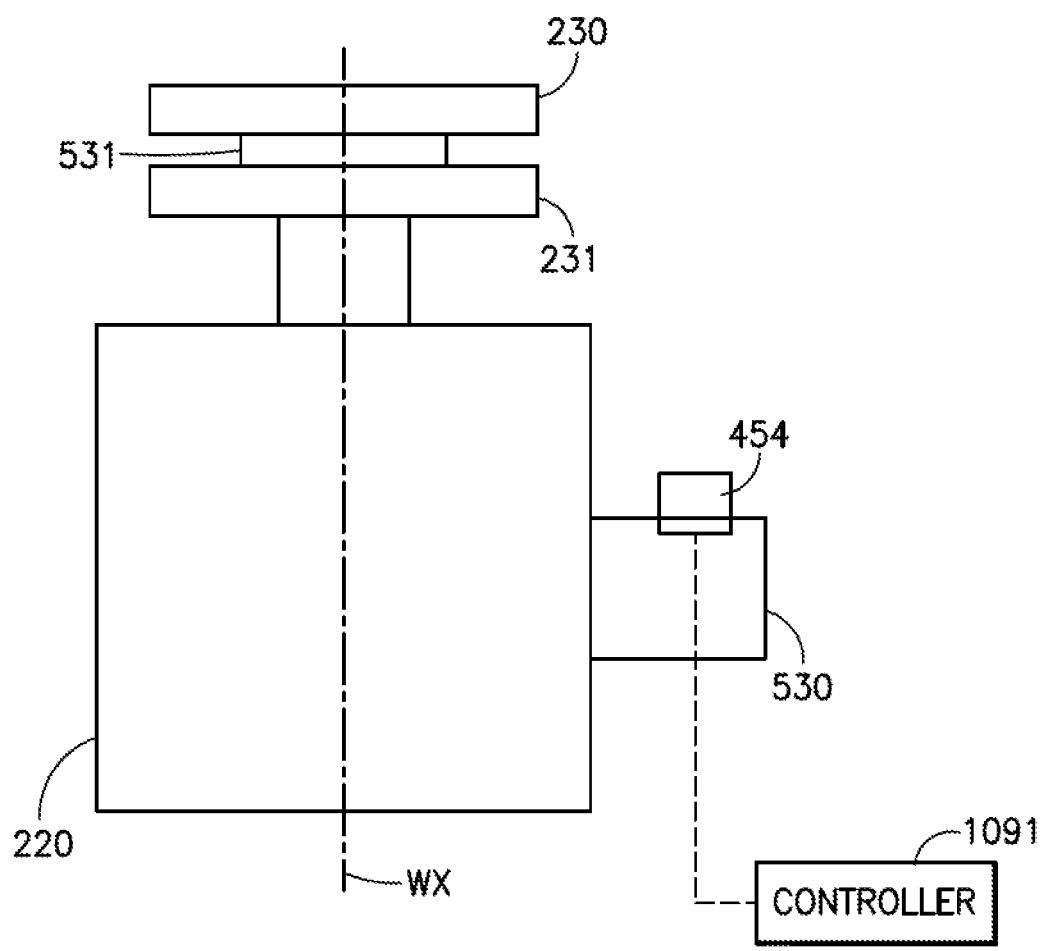

In this aspect, one or more sensory components 450, 452, 454 are disposed on one or more of the support member 530 and the base arm member 532. As described previously, the sensors 450, 452, 454 are any suitable sensors, such as, reflective sensors 454, through beam sensors 450, 452, capacitive sensors, inductive sensors, or any other sensor, capable of detecting the presence of and/or the edge of substrates as the substrates, held on a respective end effector, pass between or by the sensors 450, 452, 454 located on one or more of the support member 530 and base arm member 532 to effect automatic wafer centering as described herein. In one aspect the sensor 454 is located on the support member 530 and comprises a reflective, inductive, capacitive, etc. sensor so that the base arm 532 is free from sensory components and the corresponding wire. In other aspects the sensors 450, 452 are located on the support member 530 and the base arm member 532 and comprise through beam sensors/components. In another aspect, as illustrated in FIG. 5D, the support member 530 may pass along the side of the base arm member 532 with the end effectors 230, 231 passing over or under one or more sensors 454 located on the support member 530 where the one or more sensors include, reflective, inductive, capacitive, etc. sensors.

Figure 6A:
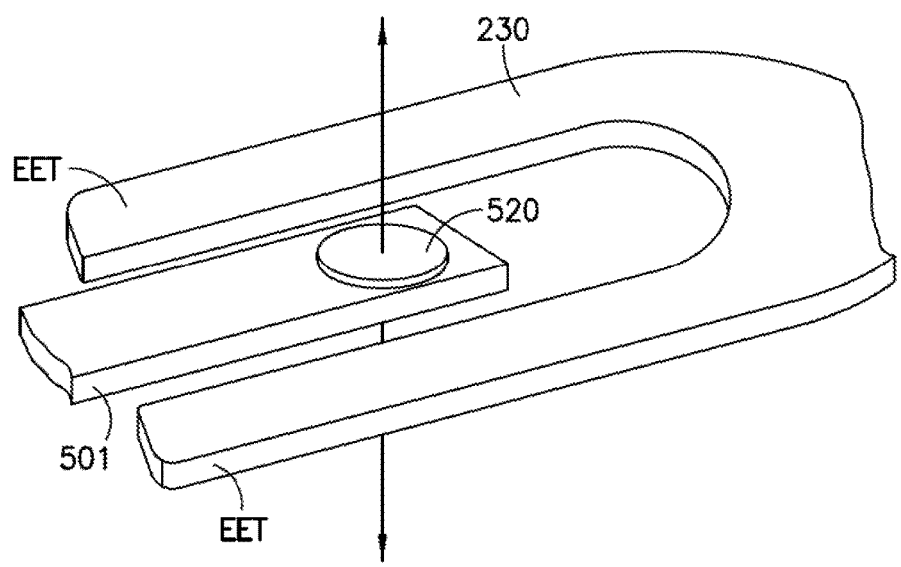
FIGS. 6A and 6B are schematic illustrations of a portion of substrate transport apparatus in accordance with an aspect of the disclosed embodiment.
Figure 6B:
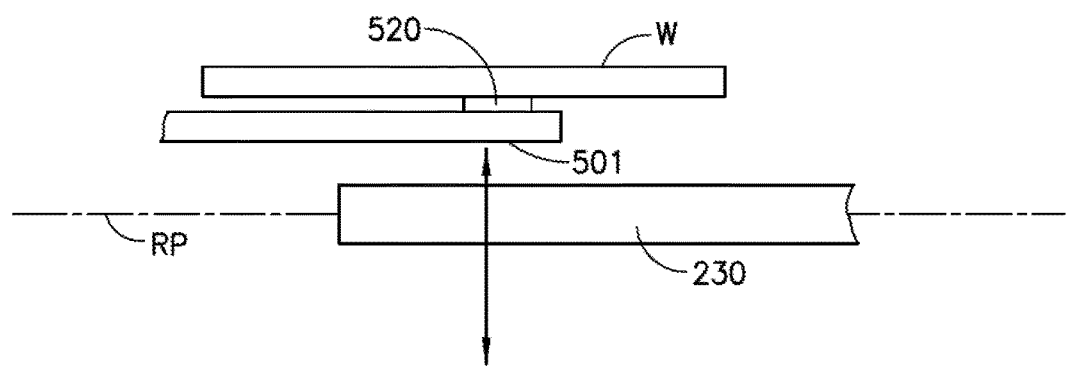

It is noted, referring to FIGS. 6A and 6B, that the base 501 and substrate holder 520 may be configured to pass through substrate holding tines EET of the end effector so that after transfer of a substrate W to the substrate holder 520 for, e.g. alignment or buffering the base 501 and substrate holder 520 (as well as the substrate W) may located above a rotational plane RP of the end effector 230, 231. Allowing the end effector(s) 230, 231 to rotate after placement of the substrate W on the substrate holder 520 may allow for a fast swapping of substrates to and from the substrate holder 520.

Figure 7A:
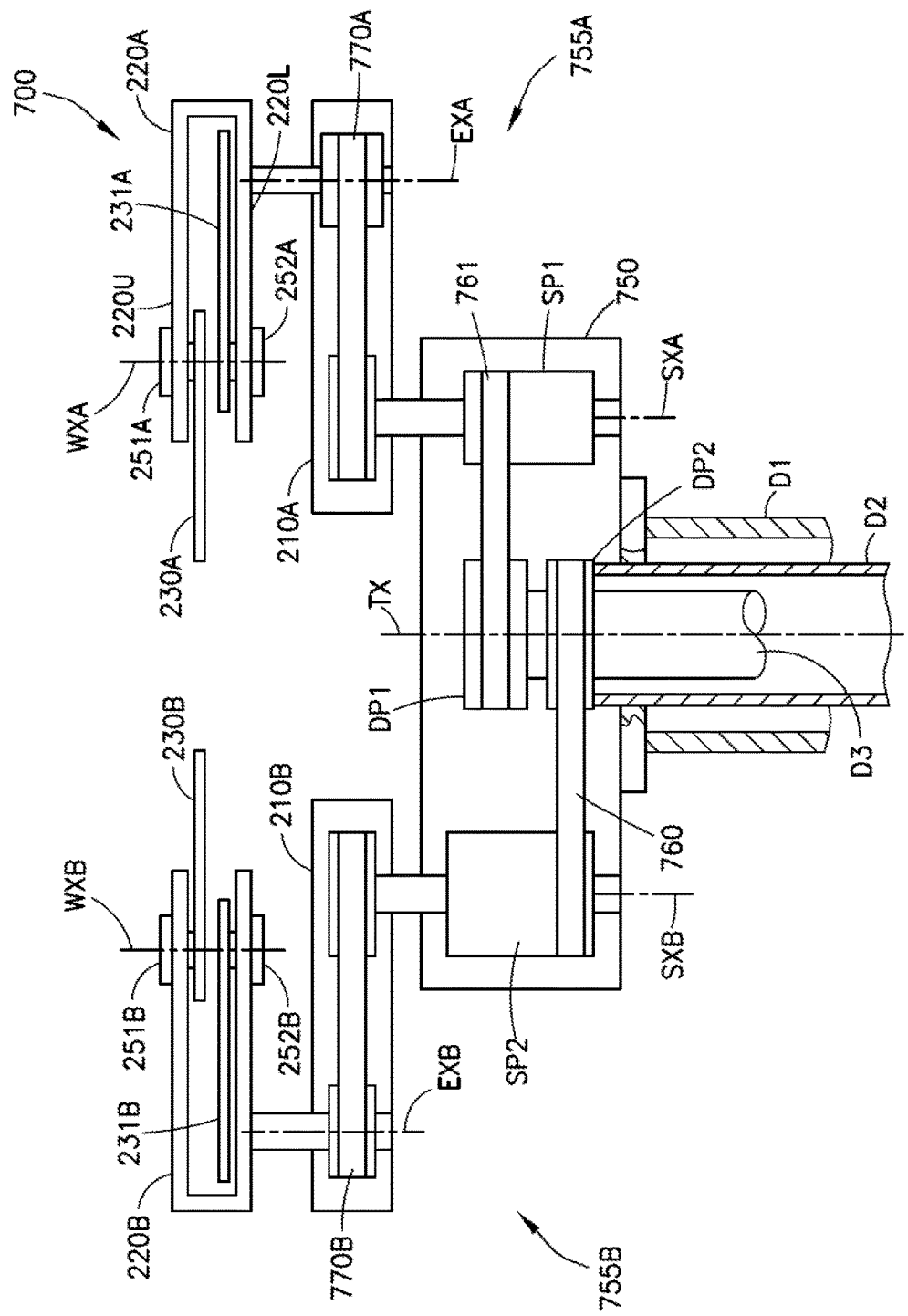
FIGS. 7A and 7B are schematic illustrations of a portion of a substrate transport apparatus in accordance with an aspect of the disclosed embodiment.
Figure 7B:
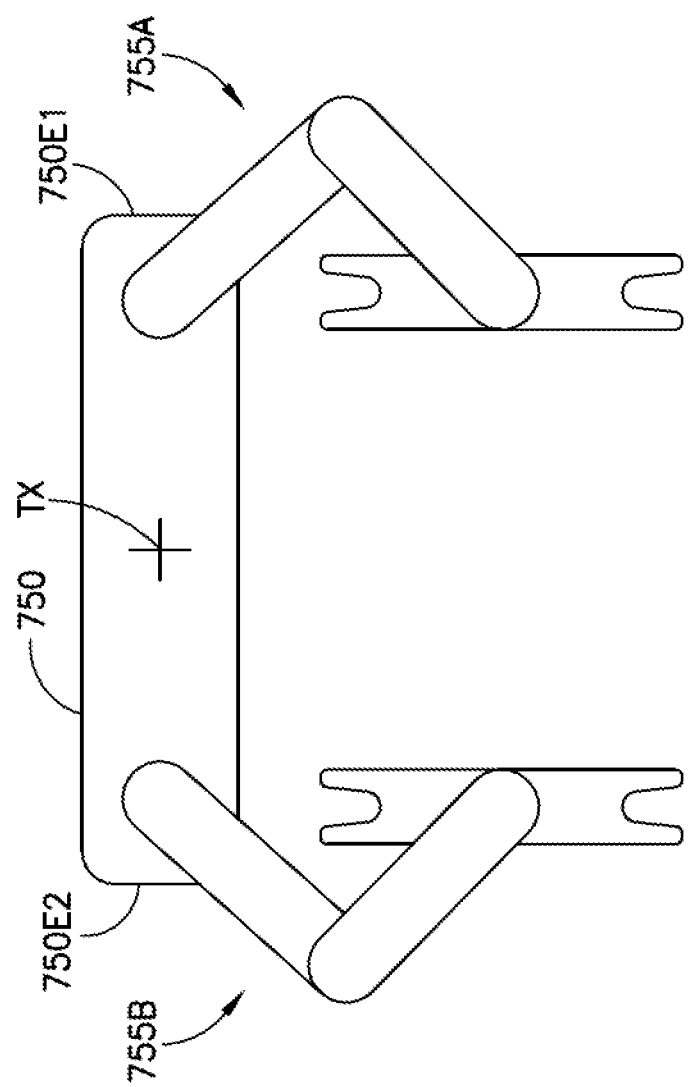

Referring to FIGS. 7A and 7B, the transport apparatus 700 may include two scara arms 755A, 755B substantially similar to arm 201 described above and a drive section. The drive section for transport apparatus 700 may be any suitable motor such as a three axis coaxial drive system substantially similar to the three axis drive system 634 described above with respect to FIG. 3B. In another aspect the drive system of transport apparatus 700 may include a three axis coaxial drive system having any suitable configuration. Other suitable examples of drive systems can be found in, for example, U.S. Pat. No. 5,720,590; U.S. patent application Ser. No. 12/163,996 filed on Jun. 27, 2008 (entitled "Robot Drive with Magnetic Spindle Bearings") and Ser. No. 13/270,844 filed on Oct. 11, 2011 (entitled "Coaxial Drive Vacuum Robot"); and U.S. Provisional patent application No. 61/510,819 filed on Jul. 22, 2011 (entitled "Compact Drive Spindle"), the disclosures of which are incorporated herein by reference in their entireties. A Z-axis drive may be coupled to the coaxial drive shaft arrangement for providing travel along the Z-direction to raise and/or lower the arm assembly in a manner substantially similar to that described above.

Each arm 755A, 755B includes an upper arm 210A, 210B, a forearm 220A, 220B mounted to the upper arm about an elbow axis EXA, EXB and at least two end effectors 230A, 231A, 230B, 231B mounted to the respective forearm 220A, 220B about a wrist axis WXA, WXB. It is noted that in one aspect one or more of the end effectors 230A, 231A, 230B, 231B may be located on the same transfer plane TP to reduce the amount of Z-motion of the arm assembly. In other aspects the end effectors may be located on different transfer planes. In this aspect, the arms 755A, 755B are mounted to and supported by a base member 750 about a respective shoulder axis SXA, SXB. For example, arm 755A is mounted to the base member 750 about shoulder axis SXA and arm 755B is mounted to the base member about shoulder axis SXB. The base member 750 may have any suitable shape and/or configuration and it is noted that the elongated rectangular shape shown in, e.g. FIG. 7B is merely exemplary in nature. As an example, the base member 750 may include a first end 750E1 and a second end 750E2 that are disposed on opposite sides of a drive axis TX around which the base member 750 rotates. Each of the arms 755A, 755B may be rotatably mounted at a respective end 750E1, 750E2 of the base member 750. In other aspects, for purposes of illustration, the base arm may have a substantially U-shaped or V-shaped configuration as shown with respect to the upper arm 1150 in FIGS. 10A and 10B.

The base member 750 may be coupled to a first drive shaft D1 (e.g. the outer drive shaft) of the drive section about drive axis TX (e.g. the axis of rotation of the coaxial drive shaft assembly) so that as the drive shaft D1 rotates the base member 750 rotates with it. A first drive pulley DP1 may be coupled to a third drive shaft D3 (e.g. the inner drive shaft) of the drive section so that as the drive shaft D3 rotates the pulley DP1 rotates with it. A first shoulder pulley SP1 may be mounted on a shaft about axis SXA where the first shoulder pulley SP1 is coupled to the first drive pulley DP1 in any suitable manner, such as through belts, bands, gears, or any other suitable transmission 761. The shoulder pulley SP1 may be coupled to the arm 755A in any suitable manner for causing the arm to extend and retract for transferring substrates to and from the arm 755A. In this aspect, rotation of the forearm 220A may be slaved to the rotation of the upper arm 210A through any suitable transmission system 770A in a known manner so that the arm 755A can be extended and retracted using only one drive axis and wrist axis WXA remains aligned with the path of extension and retraction. It should be realized that in other aspects additional drive shafts/motors may be provided in the drive section so that two or more of the upper arm, forearm and end effector of arm 755A may be individually driven.

A second drive pulley DP2 may be coupled to a second drive shaft D2 (e.g. the middle drive shaft) of the drive section so that as the drive shaft D2 rotates the drive pulley DP2 rotates with it. A second shoulder pulley SP2 may be mounted on a shaft about axis SXB where the second shoulder pulley SP2 is coupled to the second drive pulley DP2 in any suitable manner, such as through belts, bands, gears, or any other suitable transmission 760. The shoulder pulley SP2 may be coupled to the arm 755B in any suitable manner for causing the arm to extend and retract for transferring substrates to and from the arm 755B. In this aspect, rotation of the forearm 220B may be slaved to the rotation of the upper arm 210B through any suitable transmission system 770B in a known manner so that the arm 755B can be extended and retracted using only one drive axis while the wrist axis WXB remains aligned with a path of extension and retraction. It should be realized that in other aspects additional drive shafts/motors may be provided in the drive section so that two or more of the upper arm, forearm and end effector of arm 755B may be individually driven.

It is noted that the ratio between the first and second drive pulleys DP1, DP2 and the respective shoulder pulleys SP1, SP2 may be a 1:1 ratio. However, in alternate embodiments any suitable ratio may be used between the drive pulleys and the respective shoulder pulleys.

Each of the forearms 220A, 220B may be substantially similar to that described above with respect to, e.g., FIGS. 2A-2D. For example, each forearm 220A, 220B may have a generally channel-shaped structure that allows the end effectors 230A, 231A, 230B, 231B to pass between the upper forearm section 220U and lower forearm section as described above. In this aspect each of the end effectors 230A, 231A, 230B, 231B is independently driven by a respective drive motor 251A, 252A, 252B, 252B in a manner substantially similar to that described above.

Referring to FIG. 8A, in another aspect of the disclosed embodiment, the transport apparatus 800 (which may be substantially similar to transport apparatus 700) may be driven by any suitable two-axis coaxial drive system 899 such that the extension and retraction of the arms 755A, 755B is coupled. A first one of the drive shafts D1 of the two-axis coaxial drive system 899 may be coupled to the base member 750 in a manner substantially similar to that described above. A second one of the drive shafts D2 of the two-axis coaxial drive system 899 may be coupled to the drive pulleys DP1, DP2 such that as the second drive shaft D2 rotates the drive pulleys DP1, DP2 rotate with the drive shaft D2. In this aspect, one of the drive pulleys DP1, DP2 may be coupled to a respective shoulder pulley SP1, SP2 in any suitable manner so that the drive pulley and shoulder pulley rotate in the same direction (e.g. both clockwise or both counterclockwise). The other one of the drive pulleys DP1, DP2 may be coupled to a respective shoulder pulley SP1, SP2 so that the drive pulley and shoulder pulley rotate in opposite directions (e.g. one pulley rotates clockwise and the other pulley rotates counterclockwise). In this aspect, the drive pulley DP2 and shoulder pulley SP2 are coupled to each other in any suitable manner, such as through belts, bands, gears or any other suitable transmission 760, so that the pulleys DP2, SP2 rotate in the same direction. The drive pulley DP1 is coupled to the shoulder pulley SP1 in any suitable manner, such as through belts, bands, gears or any other suitable transmission 762, so that the pulleys DP1, SP1 rotate in opposite directions. For exemplary purposes the pulleys DP1, SP1 are shown in FIG. 8B as being coupled by a "FIG. 8" belt/band arrangement so that as the shaft D2 rotates the pulleys SP1, SP2 are rotated in opposite directions. As may be realized, with this two-axis drive arrangement and corresponding transmissions between the driven pulleys DP1, DP2 and the respective shoulder pulleys SP1, SP2 the arms 755A, 755B may be extended substantially simultaneously (e.g. both arms extend into and are retracted from substrate holding locations substantially simultaneously, such as with the "FIG. 8" belt/band arrangement or any other suitable reverse rotation drive configuration) or one arm 755A, 755B may be extended while the other arm 2055A, 2055B is retracted. In other aspects, the coupling between the drive shaft D2 and the shoulder pulleys SP1, SP2 may be a lost motion coupling substantially similar to those described in U.S. patent application Ser. No. 12/117,415 entitled "Substrate Transport Apparatus with Multiple Movable Arms Utilizing a Mechanical Switch Mechanism" and filed on May 8, 2008 and U.S. patent application Ser. No. 11/697,390 entitled "Substrate Transport Apparatus with Multiple Independently Movable Articulated Arms" and filed on Apr. 6, 2007 the disclosure of which are incorporated by reference herein in their entireties.

Referring to FIG. 9, the end effectors 230, 231 of the transport arms described herein may also be driven by a single drive 251' using a reverse transmission in a manner substantially similar to that described above with respect to FIG. 8A. For example, the end effectors 230, 231 may be rotatably mounted to the forearm 220 by a coaxial shaft/pulley arrangement. For example, end effector 230 may be coupled to shaft/pulley EP1 (hereinafter referred to as "shaft EP1") so that as the shaft EP1 rotates the end effector 230 rotates with it. Similarly, end effector 231 may be coupled to shaft/pulley EP2 (hereinafter referred to as "shaft EP2") so that as the shaft EP2 rotates the end effector 231 rotates with it. The drive 251' may include any suitable motor 251M for driving shaft EPD. Shaft EPD may be coupled to shaft EP1 by any suitable transmission 960 that may be substantially similar to transmission 760 described above so that shafts 960 and EP rotate in the same direction. Shaft EPD may be coupled to shaft EP2 by any suitable transmission 962 which may be substantially similar to transmission 762 described above so that shafts EPD and EP2 rotate in opposite directions. As may be realized, the opposite rotation of the shafts EP1, EP2 allow the end effectors to be driven by a single drive 251' for transferring substrates to and from each of the end effectors 230, 231.

Figure 10A:
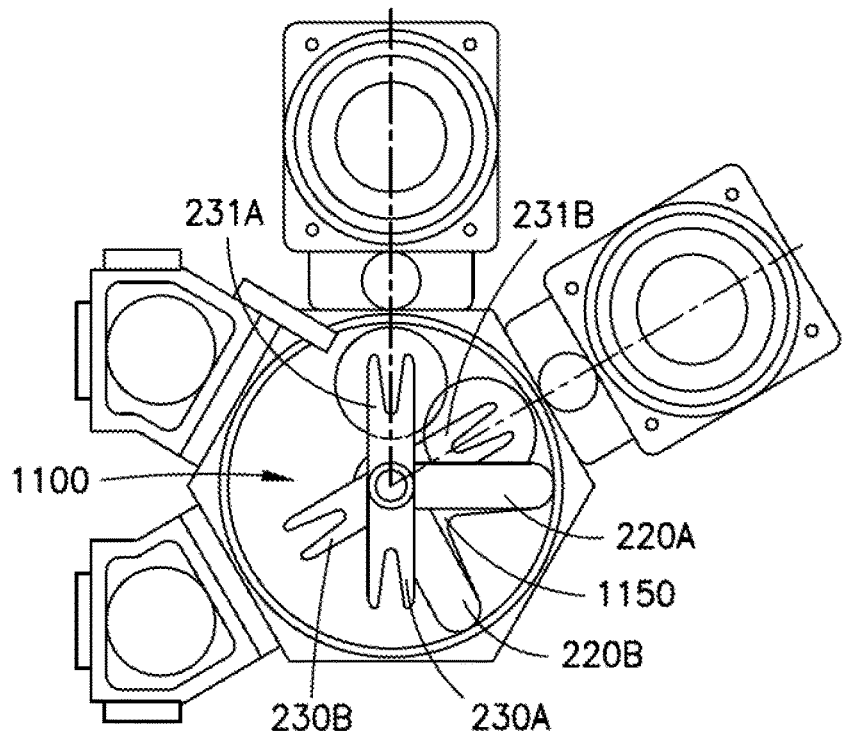
FIGS. 10A and 10B are schematic illustrations of a portion of a substrate transport apparatus in accordance with an aspect of the disclosed embodiment.
Figure 10B:
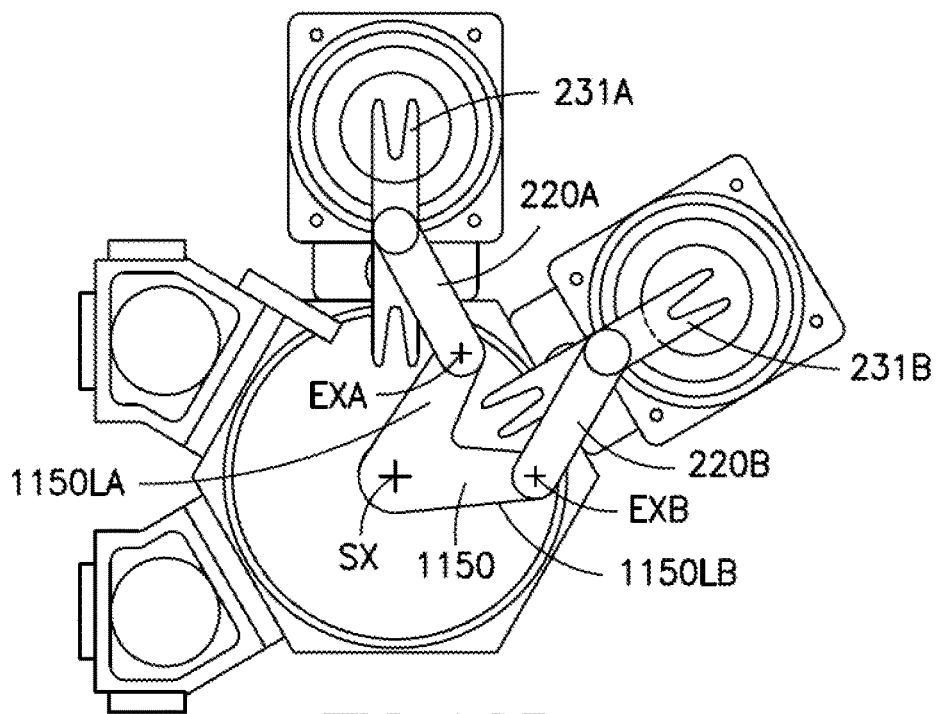

Referring also to FIGS. 10A and 10B the transport apparatus 1100 may include a common upper arm 1150 to which the forearms 220A, 220B are rotatably mounted. For example, the common upper arm 1150 may be a substantially rigid link that has a substantially U-shaped or V-shaped configuration. In other aspects the common upper arm may have a rectangular shape substantially similar to that of the base arm 750 described above. Here the substantially U-shaped or V-shaped configuration has a vertex that is substantially disposed at the shoulder axis of rotation where each forearm 220A, 220B is rotatably mounted at an elbow axis of rotation EXA, EXB disposed at a respective one of the legs 1150LA, 1150LB of the common upper arm 1150. In one aspect the rotation of the forearms 220A, 220B about their respective axes EXA, EXB may be coupled in a manner substantially similar to that described above for the upper arms 210A, 210B with respect to FIGS. 7A-8B. In other aspects each of the forearms 220A, 220B may be independently rotated about their respective axes EXA, EXB in any suitable manner, such as through a coaxial drive shaft arrangement located at, e.g. the shoulder axis of rotation SX or by individual drives disposed at the respective elbow axes EXA, EXB. It is noted that the transmissions disposed in the base arm 750 described above (and in this aspect, the common upper arm 1150) with respect to FIGS. 7A, 8A and 8B may be arranged such that the angle θ between shoulder pulleys (and in this aspect the elbow pulleys that cause rotation of the forearms 220A, 220B) may be any suitable angle that may depend on the shape of the base arm 750 or common upper arm 1150. The end effectors 230A, 231A, 230B, 231B may be rotated about their respective wrist axes in any suitable manner, such as those described above.

In accordance with one or more aspects of the disclosed embodiment a substrate transport apparatus is provided. The substrate transport apparatus includes a frame, an upper arm rotatably mounted to the frame about a shoulder axis, a forearm rotatably mounted to the upper arm about an elbow axis where the forearm includes stacked forearm sections dependent from the upper arm through a common joint and independent stacked end effectors rotatably mounted to the forearm, the forearm being common to the independent stacked end effectors, wherein at least one end effector is mounted to the stacked forearm sections at a wrist axis where the forearm is configured such that spacing between the independent stacked end effectors mounted to the stacked forearm sections is decoupled from a height build up between end effectors accommodating pass through instrumentation.

In accordance with one or more aspects of the disclosed embodiment the stacked forearm sections include an upper forearm section and a lower forearm section joined to each other by a connecting member so that the upper forearm section and lower forearm section form a one piece assembly unit.

In accordance with one or more aspects of the disclosed embodiment the at least one end effector is mounted to at least one of the upper forearm section and lower forearm section and disposed between the upper forearm section and lower forearm section.

In accordance with one or more aspects of the disclosed embodiment the at least one end effector can pass entirely between the upper forearm section and lower forearm section.

In accordance with one or more aspects of the disclosed embodiment the at least one end effector includes a first end effector rotatably mounted to the upper forearm section and a second end effector rotatable mounted to the lower forearm section where the first and second end effectors are arranged in an opposing relationship between the upper forearm section and lower forearm section.

In accordance with one or more aspects of the disclosed embodiment where the wrist axis is a common axis of rotation to both the first and second end effectors.

In accordance with one or more aspects of the disclosed embodiment each the first and second end effector is rotatable independent of the other one of the first and second end effector.

In accordance with one or more aspects of the disclosed embodiment the first and second end effector are coupled to each other through a bearing disposed between the opposing first and second end effector.

In accordance with one or more aspects of the disclosed embodiment the first and second end effectors are coupled to each other so that the first and second end effectors rotate about the wrist axis as a unit.

In accordance with one or more aspects of the disclosed embodiment electrical wires and pneumatic lines for each of the first and second end effectors are provided substantially directly to a respective one of the first and second end effectors from the forearm independent of electrical wire and pneumatic line routing for the other one of the first and second end effector.

In accordance with one or more aspects of the disclosed embodiment at least one wafer center finding sensor is provided on the forearm where the at least one wafer center finding sensor is disposed to sense a substrate, held on the at least one end effector, that is passed between the upper and lower forearm section.

In accordance with one or more aspects of the disclosed embodiment wherein the at least one end effector is configured so that the substrate held on the at least one end effector rotationally passes between the upper and lower forearm section.

In accordance with one or more aspects of the disclosed embodiment at least one end effector is cantilevered from the connecting member so as to extend between the upper and lower forearm sections.

In accordance with one or more aspects of the disclosed embodiment the at least one end effector includes a rotatable substrate holder and a substrate orientation detection sensor is disposed on one or more of the upper and lower forearm sections, the a substrate orientation detection sensor being configured to detect a substrate alignment feature of a substrate being held and rotated by the rotatable substrate holder.

In accordance with one or more aspects of the disclosed embodiment wherein the end effector is movably mounted to the connecting member so as to move in a direction substantially perpendicular to a plane of rotation of the at least one substrate holder.

In accordance with one or more aspects of the disclosed embodiment the substrate transport includes a distributed drive section having drive motors disposed substantially about at least two of the shoulder axis, elbow axis and wrist axis for driving respective ones of the upper arm forearm and at least one end effector.

In accordance with one or more aspects of the disclosed embodiment the substrate transport includes at least one coaxial drive shaft arrangement where each shaft in the coaxial drive shaft arrangement is drivingly coupled to a respective one of the upper arm forearm and at least one end effector. In accordance with one or more aspects of the disclosed embodiment the substrate transport apparatus includes end effector motors disposed in the forearm and offset from both of the elbow and wrist axes.

In accordance with one or more aspects of the disclosed embodiment one of the stacked forearm sections forms a support member spaced apart from another one of the stacked forearm sections so as to form a pass through which the independent stacked end effectors rotate through.

In accordance with one or more aspects of the disclosed embodiment the support member is coupled to the other one of the stacked forearm sections so that the support member and the other one of the stacked forearm sections rotate as a unit and the independent stacked end effectors are rotatably mounted to the other one of the stacked forearm sections.

In accordance with one or more aspects of the disclosed embodiment the support member allows for passage of at least one pass through instrumentation over or through the support member.

In accordance with one or more aspects of the disclosed embodiment at least one sensor is provided on one or more of the support member and the other one of the stacked forearm sections where the at least one sensor is disposed to sense a substrate, held on at least one end effector, that is rotated between the support member and the other one of the stacked forearm sections.

In accordance with one or more aspects of the disclosed embodiment a substrate transport apparatus is provided. The substrate apparatus includes a frame, a base member rotatably mounted to the frame about a base member axis of rotation, at least one articulated arm mounted to the base member about a respective shoulder axis, each of the at least one articulated arm including, an upper arm rotatably mounted about the respective shoulder axis, a forearm rotatably coupled to the upper arm about an elbow axis and having an upper and lower forearm section joined to each other so as to rotate as a unit about the elbow axis, and independent stacked end effectors rotatably mounted to at least one of upper forearm section and the lower forearm section about a common wrist axis, wherein the forearm is configured such that spacing between the independent stacked end effectors mounted to at least one of the upper forearm sections and lower forearm sections is decoupled from a height build up between the independent stacked end effectors.

In accordance with one or more aspects of the disclosed embodiment the spacing between the independent stacked end effectors is decoupled from a height build up between the independent stacked end effectors to accommodate pass through instrumentation.

In accordance with one or more aspects of the disclosed embodiment the at least one articulated arm comprises two articulated arms mounted to opposite ends of the base member relative to the base member axis of rotation.

In accordance with one or more aspects of the disclosed embodiment the substrate transport apparatus includes a drive section connected to the at least one articulated arm such that an extension and retraction of each of the at least one articulated arm is coupled to other another one of the at least one articulated arm.

In accordance with one or more aspects of the disclosed embodiment the substrate transport apparatus includes a drive section connected to the at least one articulated arm such that each of the at least one articulated arm extends and retracts independently of another one of the at least one articulated arm.

In accordance with one or more aspects of the disclosed embodiment the independent stacked end effectors include a first end effector rotatably mounted to the upper forearm section and a second end effector rotatably mounted to the lower forearm section where the first and second end effectors are arranged in an opposing relationship between the upper forearm section and lower forearm section.

In accordance with one or more aspects of the disclosed embodiment electrical wires and pneumatic lines for each of the first and second end effectors are provided substantially directly to a respective one of the first and second end effectors from the forearm independent of electrical wire and pneumatic line routing for the other one of the first and second end effector.

In accordance with one or more aspects of the disclosed embodiment at least one wafer center finding sensor is provided on the forearm where the at least one wafer center finding sensor is disposed to sense a substrate, held on at least one end effector of the independent stacked effectors, that is passed between the upper and lower forearm section.

In accordance with one or more aspects of the disclosed embodiment the independent stacked end effectors are configured so that a substrate held on each of the independent stacked end effectors rotationally passes between the upper forearm section and the lower forearm section.

In accordance with one or more aspects of the disclosed embodiment the upper forearm section forms a support member spaced apart from the lower forearm section so as to form a pass through which the independent stacked end effectors rotate through.

In accordance with one or more aspects of the disclosed embodiment the independent stacked end effectors are rotatably mounted to the lower forearm section.

In accordance with one or more aspects of the disclosed embodiment the support member allows for passage of at least one pass through instrumentation over or through the support member.

In accordance with one or more aspects of the disclosed embodiment at least one sensor is provided on one or more of the support member and the lower forearm section where the at least one sensor is disposed to sense a substrate, held on at least one end effector of the independent stacked end effectors, that is rotated between the support member and the lower forearm section.

In accordance with one or more aspects of the disclosed embodiment a substrate processing apparatus is provided. The substrate apparatus includes a frame forming a chamber, a transport apparatus disposed at least partly within the chamber, the transport apparatus including a drive section connected to the chamber, an upper arm rotatably mounted to the drive section about a shoulder axis, a forearm rotatably mounted to the upper arm about an elbow axis where the forearm includes branched forearm sections dependent from the upper arm through a common joint, and independent stacked end effectors rotatably mounted to the forearm, the forearm being common to the independent stacked end effectors, wherein at least one end effector is mounted to the branched forearm sections at a wrist axis, where the forearm is configured such that spacing between the independent stacked end effectors mounted to the branched forearm sections is decoupled from a height build up between end effectors.

In accordance with one or more aspects of the disclosed embodiment, the spacing between the independent stacked end effectors is decoupled from a height build up between end effectors accommodating pass through instrumentation.

In accordance with one or more aspects of the disclosed embodiment the branched forearm sections include an upper forearm section and a lower forearm section joined to each other by a connecting member so that the upper forearm section and lower forearm section form a one piece assembly unit.

In accordance with one or more aspects of the disclosed embodiment the at least one end effector is mounted to at least one of the upper forearm section and lower forearm section and disposed between the upper forearm section and lower forearm section.

In accordance with one or more aspects of the disclosed embodiment the at least one end effector can pass entirely between the upper forearm section and lower forearm section.

In accordance with one or more aspects of the disclosed embodiment the independent stacked end effectors include a first end effector and a second end effector, and electrical wires and pneumatic lines for each of the first and second end effectors are provided substantially directly to a respective one of the first and second end effectors from the forearm independent of electrical wire and pneumatic line routing for the other one of the first and second end effector.

In accordance with one or more aspects of the disclosed embodiment at least one wafer center finding sensor is provided on the forearm where the at least one wafer center finding sensor is disposed to sense a substrate, held on the at least one end effector, that is passed between the branched forearm sections.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate transport apparatus comprising:
   a frame;
   an upper arm rotatably mounted to the frame about a shoulder axis;
   a forearm rotatably mounted to the upper arm about an elbow axis where the forearm includes stacked forearm sections dependent from the upper arm through a common joint; and
   independent stacked end effectors rotatably mounted to the forearm, the forearm being common to the independent stacked end effectors, wherein at least one end effector is mounted to the stacked forearm sections at a wrist axis;
   where the forearm is configured such that spacing between the independent stacked end effectors mounted to the stacked forearm sections is decoupled from a height build up between end effectors accommodating pass through instrumentation.

2. The substrate transport apparatus of claim 1, wherein the stacked forearm sections include an upper forearm section and a lower forearm section joined to each other by a connecting member so that the upper forearm section and lower forearm section form a one piece assembly unit.

3. The substrate transport apparatus of claim 2, wherein the at least one end effector is mounted to at least one of the upper forearm section and lower forearm section and disposed between the upper forearm section and lower forearm section.

4. The substrate transport apparatus of claim 2, wherein the at least one end effector can pass entirely between the upper forearm section and lower forearm section.

5. The substrate transport apparatus of claim 2, wherein the at least one end effector includes a first end effector rotatably mounted to the upper forearm section and a second end effector rotatable mounted to the lower forearm section where the first and second end effectors are arranged in an opposing relationship between the upper forearm section and lower forearm section.

6. The substrate transport apparatus of claim 5, wherein the wrist axis is a common axis of rotation to both the first and second end effectors.

7. The substrate transport apparatus of claim 5, wherein each of the first and second end effector is rotatable independent of the other one of the first and second end effector.

8. The substrate transport apparatus of claim 5, wherein the first and second end effector are coupled to each other through a bearing disposed between the opposing first and second end effector.

9. The substrate transport apparatus of claim 5, wherein the first and second end effectors are coupled to each other so that the first and second end effectors rotate about the wrist axis as a unit.

10. The substrate transport apparatus of claim 5, wherein electrical wires and pneumatic lines for each of the first and second end effectors are provided substantially directly to a respective one of the first and second end effectors from the forearm independent of electrical wire and pneumatic line routing for the other one of the first and second end effector.

11. The substrate transport apparatus of claim 2, wherein at least one wafer center finding sensor is provided on the forearm where the at least one wafer center finding sensor is disposed to sense a substrate, held on the at least one end effector, that is passed between the upper and lower forearm section.

12. The substrate transport apparatus of claim 2, wherein the at least one end effector is configured so that the substrate held on the at least one end effector rotationally passes between the upper and lower forearm section.

13. The substrate transport apparatus of claim 2, wherein at least one end effector is cantilevered from the connecting member so as to extend between the upper and lower forearm sections.

14. The substrate transport apparatus of claim 2, wherein the at least one end effector further comprises a rotatable substrate holder and a substrate orientation detection sensor is disposed on one or more of the upper and lower forearm sections, the a substrate orientation detection sensor being configured to detect a substrate alignment feature of a substrate being held and rotated by the rotatable substrate holder.

15. The substrate transport apparatus of claim 2, wherein the at least one end effector is movably mounted to the connecting member so as to move in a direction substantially perpendicular to a plane of rotation of the at least one substrate holder.

16. The substrate transport apparatus of claim 1, further comprising a distributed drive section having drive motors disposed substantially about at least two of the shoulder axis, elbow axis and wrist axis for driving respective ones of the upper arm, forearm and at least one end effector.

17. The substrate transport apparatus of claim 1, further comprising at least one coaxial drive shaft arrangement where each shaft in the coaxial drive shaft arrangement is drivingly coupled to a respective one of the upper arm, forearm and at least one end effector.

18. The substrate transport apparatus of claim 1, further comprising end effector motors disposed in the forearm and offset from both of the elbow and wrist axes.

19. The substrate transport apparatus of claim 1, wherein one of the stacked forearm sections forms a support member spaced apart from another one of the stacked forearm sections so as to form a pass through which the independent stacked end effectors rotate through.

20. The substrate transport apparatus of claim 19, wherein the support member is coupled to the other one of the stacked forearm sections so that the support member and the other one of the stacked forearm sections rotate as a unit and the independent stacked end effectors are rotatably mounted to the other one of the stacked forearm sections.

21. The substrate transport apparatus of claim 19, wherein the support member allows for passage of at least one pass through instrumentation over or through the support member.

22. The substrate transport apparatus of claim 19, wherein at least one sensor is provided on one or more of the support member and the other one of the stacked forearm sections where the at least one sensor is disposed to sense a substrate, held on at least one end effector, that is rotated between the support member and the other one of the stacked forearm sections.

23. A substrate transport apparatus comprising:
a frame;
a base member rotatably mounted to the frame about a base member axis of rotation;
at least one articulated arm mounted to the base member about a respective shoulder axis, each of the at least one articulated arm including
an upper arm rotatably mounted about the respective shoulder axis,
a forearm rotatably coupled to the upper arm about an elbow axis and having an upper and lower forearm section joined to each other so as to rotate as a unit about the elbow axis, and
independent stacked end effectors rotatably mounted to at least one of upper forearm section and the lower forearm section about a common wrist axis;
wherein the forearm is configured such that spacing between the independent stacked end effectors mounted to at least one of the upper forearm sections and lower forearm sections is decoupled from a height build up between the independent stacked end effectors.

24. The substrate transport apparatus of claim 23, wherein the at least one articulated arm comprises two articulated arms mounted to opposite ends of the base member relative to the base member axis of rotation.

25. The substrate transport apparatus of claim 23, further comprising a drive section connected to the at least one articulated arm such that an extension and retraction of each of the at least one articulated arm is coupled to other another one of the at least one articulated arm.

26. The substrate transport apparatus of claim 23, further comprising a drive section connected to the at least one articulated arm such that each of the at least one articulated arm extends and retracts independently of another one of the at least one articulated arm.

27. The substrate transport apparatus of claim 23, wherein the independent stacked end effectors include a first end effector rotatably mounted to the upper forearm section and a second end effector rotatably mounted to the lower forearm section where the first and second end effectors are arranged in an opposing relationship between the upper forearm section and lower forearm section.

28. The substrate transport apparatus of claim 27, wherein electrical wires and pneumatic lines for each of the first and second end effectors are provided substantially directly to a respective one of the first and second end effectors from the forearm independent of electrical wire and pneumatic line routing for the other one of the first and second end effector.

29. The substrate transport apparatus of claim 23, wherein at least one wafer center finding sensor is provided on the forearm where the at least one wafer center finding sensor is disposed to sense a substrate, held on at least one end effector of the independent stacked effectors, that is passed between the upper and lower forearm section.

30. The substrate transport apparatus of claim 23, wherein the independent stacked end effectors are configured so that a substrate held on each of the independent stacked end effectors rotationally passes between the upper forearm section and the lower forearm section.

31. The substrate transport apparatus of claim 23, wherein the upper forearm section forms a support member spaced apart from the lower forearm section so as to form a pass through which the independent stacked end effectors rotate through.

32. The substrate transport apparatus of claim 31, wherein the independent stacked end effectors are rotatably mounted to the lower forearm section.

33. The substrate transport apparatus of claim 31, wherein the support member allows for passage of at least one pass through instrumentation over or through the support member.

34. The substrate transport apparatus of claim 31, wherein at least one sensor is provided on one or more of the support member and the lower forearm section where the at least one sensor is disposed to sense a substrate, held on at least one end effector of the independent stacked end effectors, that is rotated between the support member and the lower forearm section.

35. The substrate transport apparatus of claim 23, wherein the spacing between the independent stacked end effectors is decoupled from a height build up between the independent stacked end effectors to accommodate pass through instrumentation.

36. A substrate processing apparatus comprising:
   a frame forming a chamber;
   a transport apparatus disposed at least partly within the chamber, the transport apparatus including
      a drive section connected to the chamber;
      an upper arm rotatably mounted to the drive section about a shoulder axis;
      a forearm rotatably mounted to the upper arm about an elbow axis where the forearm includes branched forearm sections dependent from the upper arm through a common joint; and
      independent stacked end effectors rotatably mounted to the forearm, the forearm being common to the independent stacked end effectors, wherein at least one end effector is mounted to the branched forearm sections at a wrist axis;
   where the forearm is configured such that spacing between the independent stacked end effectors mounted to the branched forearm sections is decoupled from a height build up between end effectors.

37. The substrate processing apparatus of claim 36, wherein the branched forearm sections include an upper forearm section and a lower forearm section joined to each other by a connecting member so that the upper forearm section and lower forearm section form a one piece assembly unit.

38. The substrate processing apparatus of claim 37, wherein the at least one end effector is mounted to at least one of the upper forearm section and lower forearm section and disposed between the upper forearm section and lower forearm section.

39. The substrate processing apparatus of claim 37, wherein the at least one end effector can pass entirely between the upper forearm section and lower forearm section.

40. The substrate processing apparatus of claim 37, wherein the independent stacked end effectors include a first end effector and a second end effector, and electrical wires and pneumatic lines for each of the first and second end effectors are provided substantially directly to a respective one of the first and second end effectors from the forearm independent of electrical wire and pneumatic line routing for the other one of the first and second end effector.

41. The substrate processing apparatus of claim 37, wherein at least one wafer center finding sensor is provided on the forearm where the at least one wafer center finding sensor is disposed to sense a substrate, held on the at least one end effector, that is passed between the branched forearm sections.

42. The substrate processing apparatus of claim 36, the spacing between the independent stacked end effectors is decoupled from a height build up between end effectors accommodating pass through instrumentation.

* * * * *